(12) United States Patent
Mordkovich

(10) Patent No.: US 6,943,629 B2
(45) Date of Patent: Sep. 13, 2005

(54) TRANSIENT PROTECTION CIRCUIT OF DARLINGTON AMPLIFIER

(76) Inventor: Mikhail Mordkovich, 2383 E. 14th St., Apt 3A, Brooklyn, NY (US) 11229

( * ) Notice: Subject to any disclaimer, the term of this patent is extended or adjusted under 35 U.S.C. 154(b) by 0 days.

(21) Appl. No.: 10/647,186

(22) Filed: Aug. 25, 2003

(65) Prior Publication Data

US 2004/0047096 A1 Mar. 11, 2004

Related U.S. Application Data

(60) Provisional application No. 60/405,803, filed on Aug. 26, 2002.

(51) Int. Cl.[7] ............................................... H02H 7/20
(52) U.S. Cl. ................................. 330/298; 330/207 P
(58) Field of Search ............................ 330/298, 207 P

(56) References Cited

U.S. PATENT DOCUMENTS

| | | | | |
|---|---|---|---|---|
| 3,866,134 A | * | 2/1975 | Higuchi et al. | 330/255 |
| 3,883,814 A | * | 5/1975 | Weisenberger | 330/274 |
| 4,077,013 A | * | 2/1978 | Morez et al. | 330/267 |
| 5,867,061 A | * | 2/1999 | Rabjohn et al. | 330/124 R |
| 6,842,075 B2 | * | 1/2005 | Johnson et al. | 330/296 |

* cited by examiner

*Primary Examiner*—Patricia Nguyen
(74) *Attorney, Agent, or Firm*—Kevin Redmond

(57) ABSTRACT

A protection circuit for Darlington amplifiers prevents destructive voltage overshoot conditions from occurring. The Darlington amplifier has a pair of transistors connected in a Darlington configuration. A biasing network is coupled to the transistors for supplying a bias voltage to the transistors. A pair of de-coupling capacitors is coupled to the transistors. One of the de-coupling capacitors is coupled to the input of the Darlington amplifier and the other is coupled to the output. The output capacitor has a larger capacitance than the input capacitor such that excessive voltage is prevented from developing on the transistors.

20 Claims, 23 Drawing Sheets

TRANSIENT PROTECTION CIRCUIT OF DARLINGTON AMPLIFIER

This application claims the benefit of provisional application No. 60/405,803, filed Aug. 26, 2002.

BACKGROUND

1. Field of the Invention

This invention relates to RF and microwave amplifiers in general and more particularly to Darlington gain block amplifiers that have improved biasing to prevent potentially damaging conditions from occurring. The invention also prevents a voltage pulse on the output of the amplifier that is formed during the start-up process, which can damage the circuitry connected to the output of the gain block amplifier.

2. Description of Related Art

Darlington gain block amplifiers are widely used in RF and microwave systems. Darlington amplifiers have a frequency range that starts at DC. The biasing conditions needed by the transistors require de-coupling capacitors at the input and output. The de-coupling capacitors determine the low end of the amplifier frequency range. Normally, Darlington gain block amplifiers receive a DC bias voltage from an ideal current source. In practice, the current source is replaced by a voltage source with a series resistor, which converts it to a reasonably good current source. The resistor value typically ranges up to a few hundred ohms. Therefore, the DC voltage from the voltage source can be up to 10 to 15 volts. An optional choke can be connected in series with the resistor to increase the total impedance at the high end of the amplifier frequency range to minimize gain and power loss.

Referring to FIG. 1, a typical Darlington gain block amplifier 12 and biasing configuration is shown. A pair of NPN transistors Q1 and Q2, are connected in a Darlington configuration. Transistor Q1 has a base QB1, an emitter QE1 and a collector QC1. Transistor Q2 has a base QB2, an emitter QE2 and a collector QC2. The emitter QE1 is connected to base QB2. The collectors QC1 and QC2 are connected together. A biasing network 14 is connected to the amplifier. Biasing network 14 supplies the proper biasing voltages to transistors Q1 and Q2. Resistor R1 is connected between base QB1 and collector QC1. Resistor R2 is connected between base QB1 and ground. Resistor R3 is connected between emitter QE1 and ground. Resistor R4 is connected between emitter QE2 and ground. A 50 ohm resistor R5 and input de-coupling capacitor C1 are serially connected between base QB1 and ground. 50 ohm resistor R6 and output de-coupling capacitor C2 are serially connected between the collectors QC1, QC2 and ground. A controlled current source P1 is connected to the collector QC1, QC2 junction. The input to the amplifier is on the base QB1. The output from the amplifier is taken from the collector QC2.

If a low frequency response is desired, the de-coupling capacitors C1 and C2 can have a significant value. For example, for a frequency of 100 KHz, the de-coupling capacitors would have a value around 0.2 $\mu$F or more. Where the input and output impedances are equal to a value of 50 ohms, the input and output de-coupling capacitors normally have the same value.

Unfortunately, an initial start-up process can result in a dangerous 'voltage bump' or overshoot voltage occurring on the transistors of the Darlington amplifier. In addition to the danger of damaging the Darlington amplifier, the voltage bump can overload and possibly damage the circuitry connected to the output of the Darlington amplifier. The transient process when the current source has a sharp ramp (small rise time) will be detailed next. The worst case is when the current source P1 goes from zero to the nominal current value instantaneously. This would occur if the current source was manually connected such as by plugging in a connector or by turning on a mechanical switch. Initially, the de-coupling capacitors C1 and C2 are not charged and transistors Q1 and Q2 are not conducting.

The initial response of the circuit of FIG. 1 can be analyzed by using an example of a simplified circuit. Turning to FIG. 2, a simplified circuit 20 of FIG. 1 is shown. All the component values in FIG. 2 are typical values for a Darlington amplifier. FIG. 2 has two current probes 11 and 12, current source P1, 510 ohm resistor R1, 580 ohm resistor R2, 50 ohm resistor R5, 50 ohm resistor R6 and 0.2 $\mu$F capacitors C1 and C2. Current source P1 has a rise time of 100 nanoseconds. The circuit of FIG. 2 was analyzed using Agilent ADS 2001 circuit simulator software. When the current source is turned on, capacitors C1 and C2 will begin to charge. However, capacitors C1 and C2 will charge at a differing rate due to the difference in time constants because series resistors R1+R5 and R6 are different. The total current will be split into two unequal parts, initially in a proportion to approximately (R1+R5)/R6.

FIGS. 3 and 4 show the voltage versus time for the simplified circuit 20 of FIG. 2 at nodes 'DC out' and 'base', respectively. FIG. 5 shows current versus time for circuit 20 at probes I1 and I2. As seen in FIG. 5, the current I1 charging C1 is about 10 times less than the current charging C2. During charging, the current source split ratio will change because a larger portion of the current will sink through R1 and R2 directly to ground. After more than 1 millisecond, C2 will be charged and its charge current I2 will drop to almost zero in FIG. 5. At this point, input capacitor C1 will also be charged and all of the 17 milliamps of current will sink through resistors R1 and R2. The total voltage drop across resistors R1 and R2 is 18.5 volts as seen in FIG. 3 and this is equivalent to the maximum voltage on node 'DC out'. The voltage drop across resistor R2 is 9.9 volts as seen in FIG. 4. This voltage is equivalent to the maximum voltage on the node 'base' of transistor Q1 of circuit 20.

When transistors Q1 and Q2 are added to the simulated circuit, they will start to conduct when the voltage across R2 reaches 2.6 to 2.8 volts. This is twice the base to emitter voltage drop (Vbe) for an indium phosphide heterojunction bi-polar transistor (InP HBT). Transistor Q1 starts to conduct when the node base voltage reaches approximately 1.3 to 1.4 volts. At this point, the current sinking through transistor Q1 will not be high. Transistor Q2 starts to conduct when the node base voltage reaches approximately 2.6 to 2.8 volts and sinks most of the current. At the time that transistor Q2 starts to conduct, the device voltage will already be 7 volts. Therefore, when transistor Q2 first starts to conduct it will be subjected to the 7 volts peak voltage. Note that the total peak current through the amplifier of FIG. 8 exceeds the nominal current source value of 17 ma because the discharging current of output capacitor C2. If the transistors survive the overvoltage and discharge current conditions, they will shunt the current until the device voltage drops to a steady value of 5 volts. This is shown in FIGS. 6–9. FIG. 6 shows the total device voltage at node 'DC out' versus time.

FIG. 7 shows the amplifier input voltage or the base voltage of input transistor Q1 versus time.

FIG. 8 shows the total device current versus time, which includes the current from the current source and the discharge current from output capacitor C2. This can be more than the total current source current.

FIG. 9 shows the emitter currents through transistors Q1 and Q2 versus time.

The most dangerous moment for the transistors is when the total device voltage reaches a maximum value (marker M5 in FIG. 6) and transistor Q2 starts to conduct (marker M4 in FIG. 9). The total device voltage is about 6.85 volts at this moment.

FIGS. 10–13 show actual oscilloscope measurements on a circuit of FIG. 1 that was built. A Keithley 236 power supply was used for the current source. An Infiniium HP 54035A oscilloscope from Agilent was used to measure the voltage versus time for various current source values. FIG. 10 shows the output voltage versus time for a current source of 11 milli-amps. FIG. 11 shows the output voltage versus time for a current source of 12 milli-amps. FIG. 12 shows the output voltage versus time for a current source of 13 milli-amps. FIG. 13 shows the output voltage versus time for a current source of 14 milli-amps.

FIGS. 10–13 show how quickly the amplifier peak voltage rises with an increase in the current source value. As seen in FIG. 13, permanent damage to the output transistors of the amplifier occurred with a current source value of 14 milli-amps. The amplifier device voltage does not come to a steady 5 volt value. Sequential gain measurements confirm that the amplifier is permanently damaged.

This problem only exists for a current source with small rise times. For a slow current source, the charging rate of the input capacitor C1 and output capacitor C2 are about the same and determined mostly by the long rise time of the current source. Therefore the output voltage will not have the peaking shape and the voltage overshoot or voltage bump problem does not occur. With a slow current source, the amplifier can typically handle up to 51 milli-amps of current. Therefore, the overshoot problem is a pure transient issue at start up. It is not a steady state power dissipation limit problem.

While various Darlington transistor biasing schemes have previously been used, they have suffered from not being able to adequately protect against destructive transient voltage overshoot conditions and from interfering with normal amplifier operation. A current unmet need exists for an improved Darlington amplifier biasing circuit that is low in cost, protects against destructive transient voltage overshoot conditions and does not interfere with normal amplifier operation.

SUMMARY

It is a feature of the invention to provide a Darlington amplifier circuit that prevents destructive transient voltage overshoot conditions from occurring.

Another feature of the invention is to provide an amplifier circuit that includes a first transistor having a first base, a first collector and a first emitter. A second transistor has a second base, a second collector and a second emitter. The emitter of the first transistor is connected to the base of the second transistor. The collector of the first transistor is connected to the collector of the second transistor. A first resistor is connected between the collector of the first transistor and the base of the first transistor. A second resistor is connected between the base of the first transistor and ground. A first capacitor is connected to the base of the first transistor. A second capacitor is connected to the collectors of the first and second transistors. The second capacitor has a capacitance value at least 5 times larger than the first capacitor.

BRIEF DESCRIPTION OF THE DRAWINGS

It is noted that the drawings of the invention are not to scale. In the drawings, like numbering represents like elements between the drawings.

DETAILED DESCRIPTION

One possible way to prevent the voltage overshoot problem on transistors Q1 and Q2 is to use a slow power supply at start-up. This solution to use a special power supply is not practical for most applications. In many cases, slow start up is not acceptable from the overall system requirements and restrictions. It is also expensive to design this type of power supply.

The voltage overshoot on transistors Q1 and Q2 at start up can be controlled by varying the capacitance ratio of capacitor C2 to C1. The ratio C2/C1 should be equal or greater than (R1+R5)/R6. This will equalize the time constant of C1*(R1+R5) and C2*R6 and therefore equalize the charging rate of capacitors C1 and C2. For the given example, If the value of C2 is made 5 to 10 times larger than the value of C1, the voltage overshoot on transistors Q1 and Q2 can be prevented.

Figure 1:
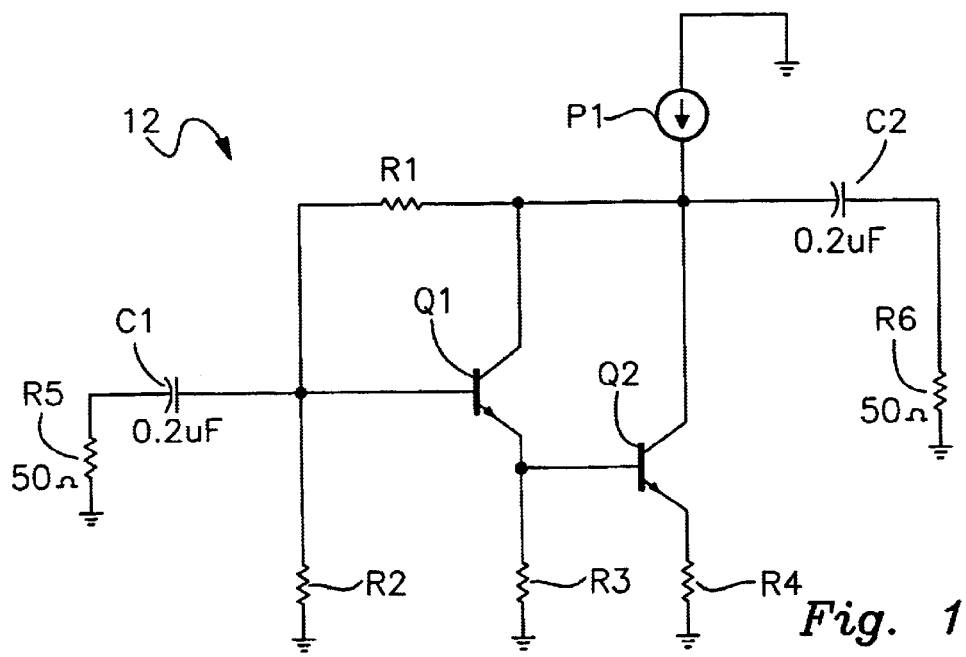
FIG. 1 is a schematic diagram of a prior art Darlington gain block amplifier.
Figure 2:
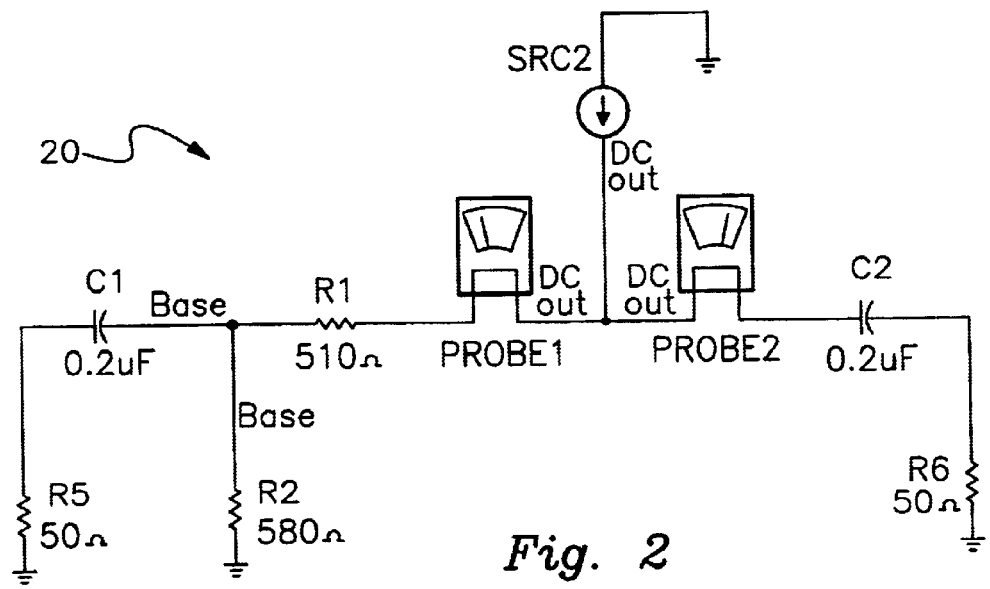
FIG. 2 is a schematic of a simplified circuit of FIG. 1.
Figure 3:
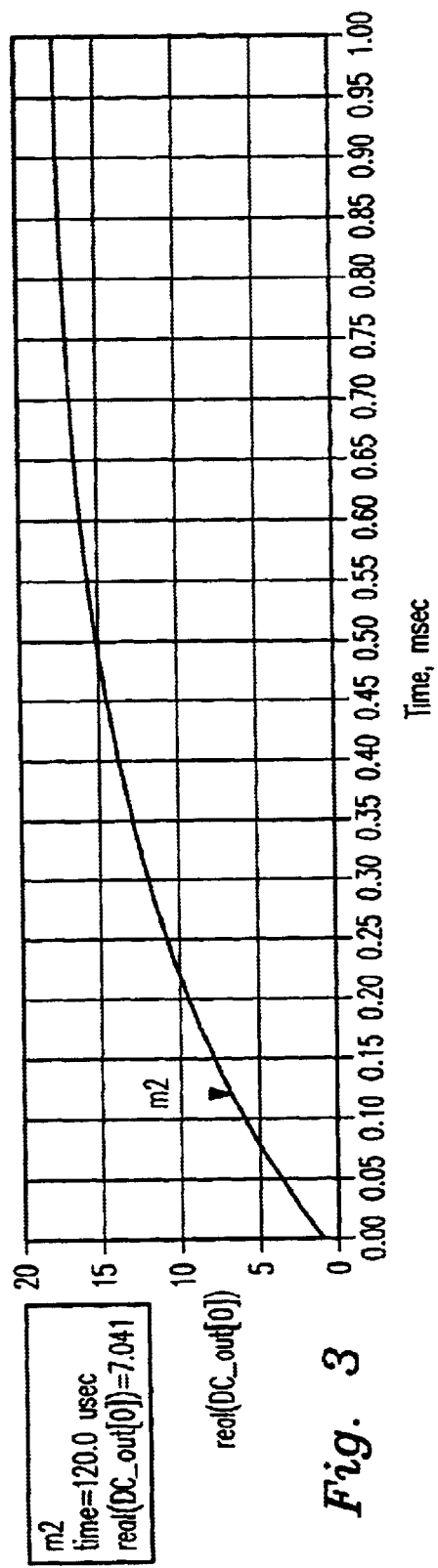
FIG. 3 is a graph of voltage at node 'dc out' versus time for the simplified circuit 20 of FIG. 2.
Figure 4:
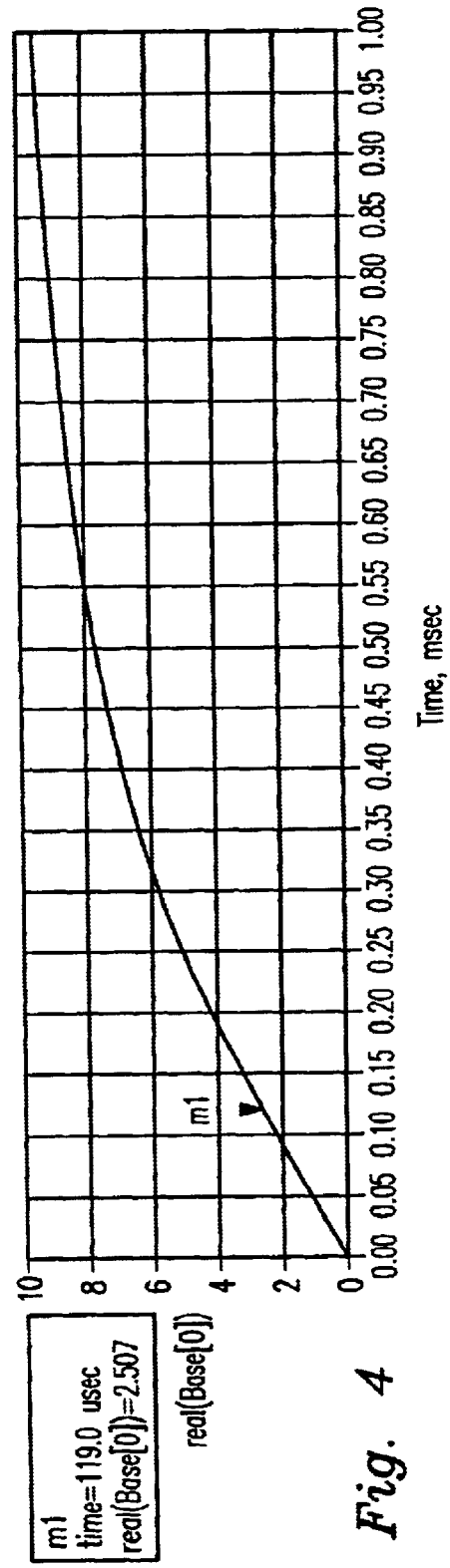
FIG. 4 is a graph of voltage at node 'base' versus time for the simplified circuit 20 of FIG. 2.
Figure 5:
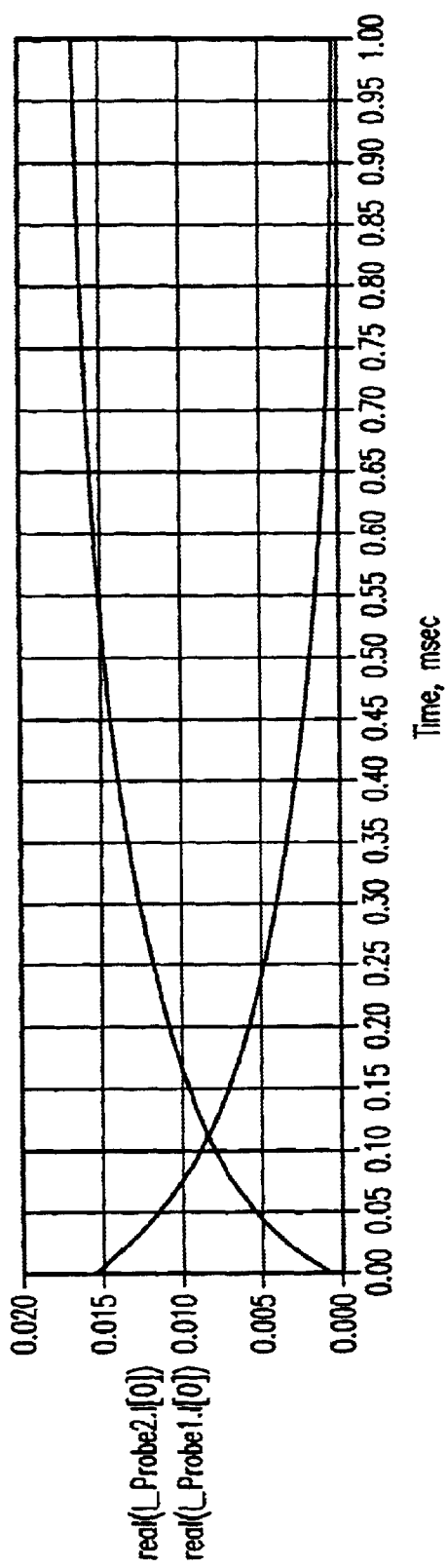
FIG. 5 is a graph of current versus time for the simplified circuit 20 of FIG. 2 showing charging of capacitors C1 and C2.
Figure 6:
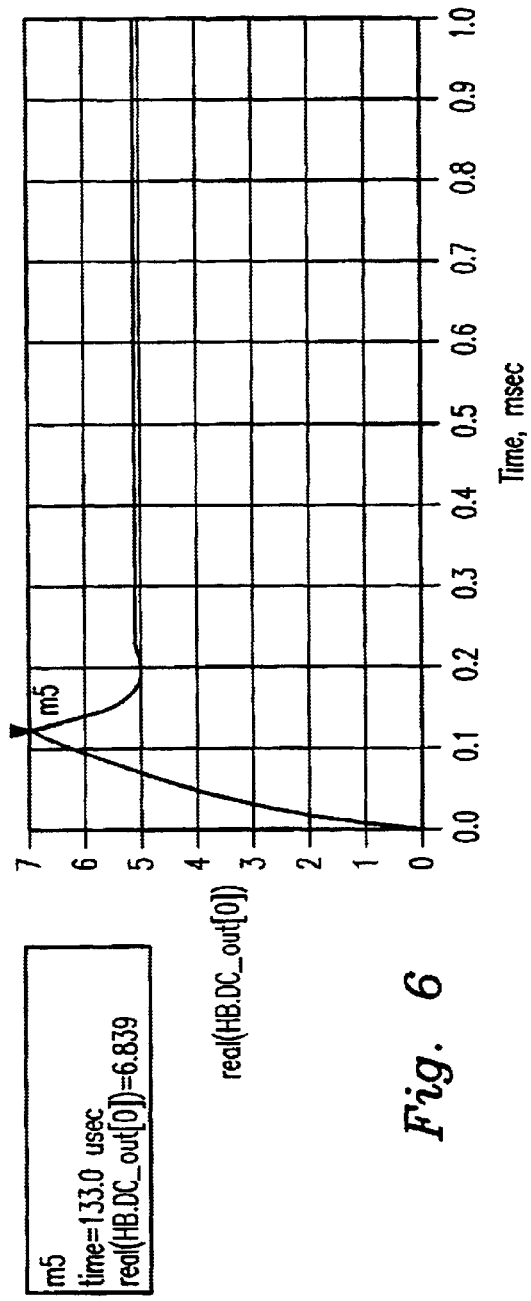
FIG. 6 is a graph of the total amplifier device voltage versus time for circuit 12 of FIG. 1.
Figure 7:
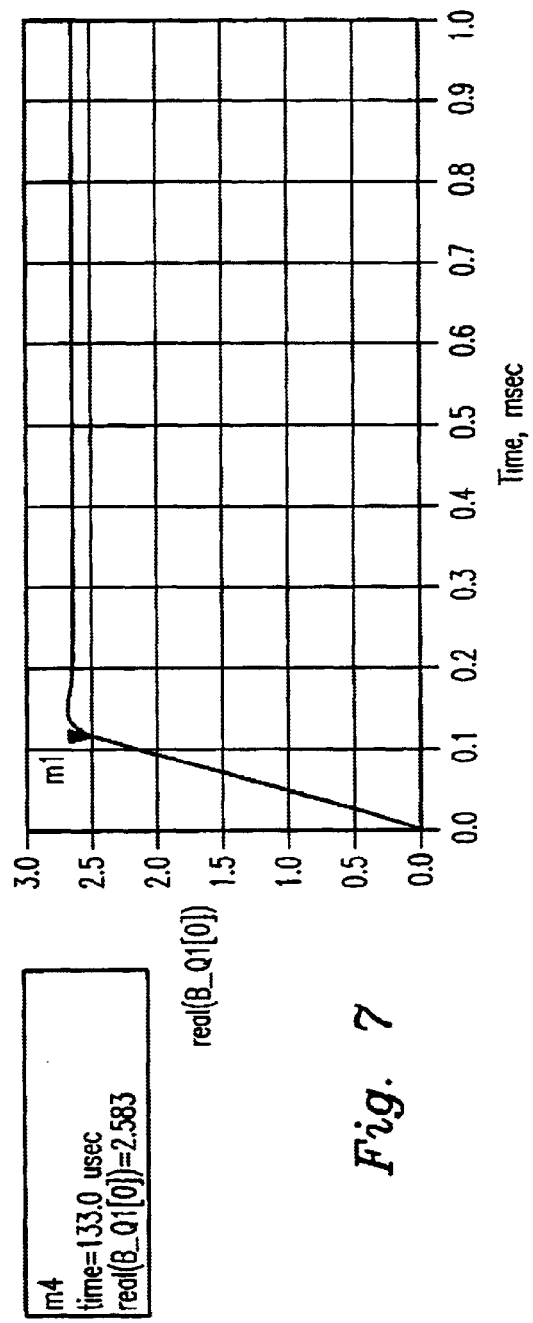
FIG. 7 is a graph of the amplifier input voltage or the base voltage of transistor Q1 versus time for circuit 12 of FIG. 1.
Figure 8:
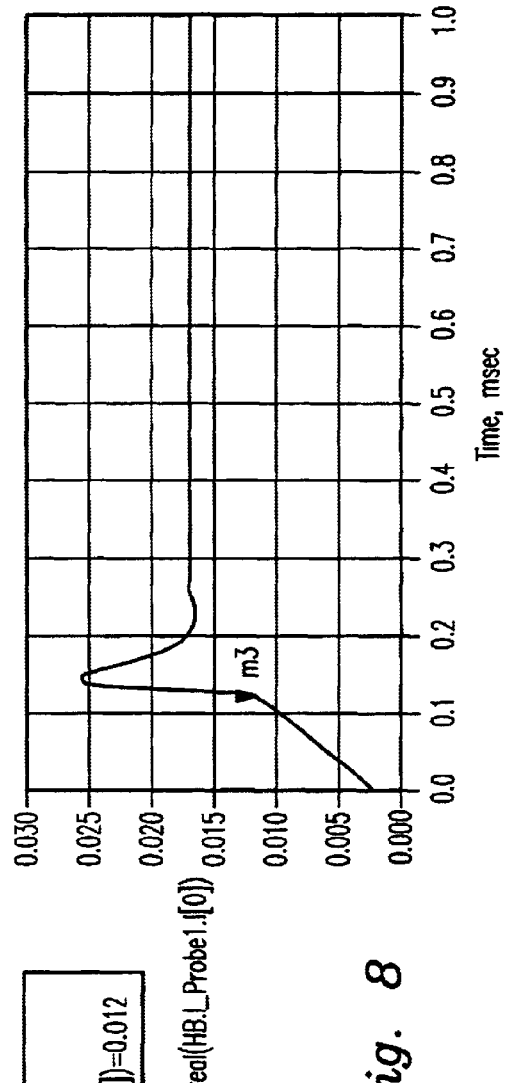
FIG. 8 is a graph of the total device current versus time for circuit 12 of FIG. 1.
Figure 14:
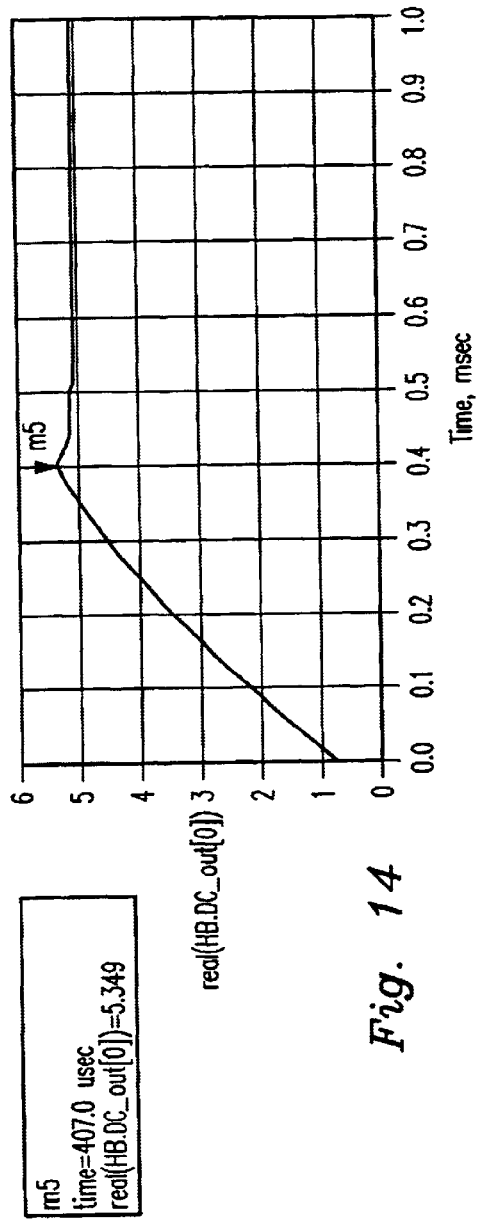
FIG. 14 is a graph of the total amplifier device voltage versus time for circuit 12 of FIG. 1 and the value of C2 is 5 times larger than C1.
Figure 15:
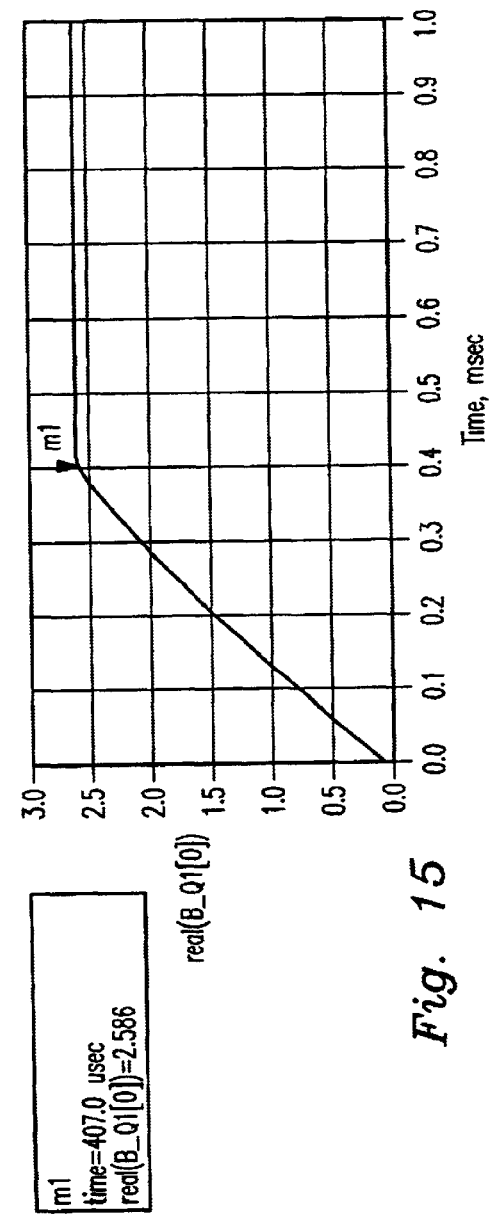
FIG. 15 is a graph of the amplifier input voltage or the base voltage of transistor Q1 versus time for circuit 12 of FIG. 1 and the value of C2 is 5 times larger than C1.
Figure 16:
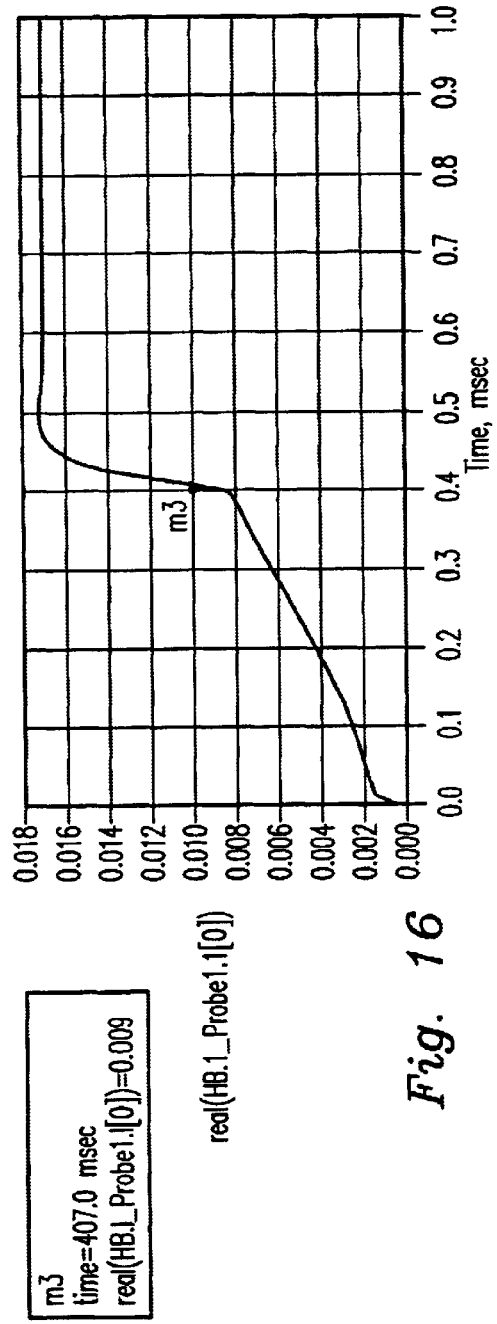
FIG. 16 is a graph of the total device current versus time for circuit 12 of FIG. 1 and the value of C2 is 5 times larger than C1.

Referring to FIGS. 14–17, a simulation is shown for circuit 12 of FIG. 1 with the value of capacitor C2 five times larger than C1. FIG. 14 is a graph of the total amplifier device voltage versus time. The 'voltage bump' or overshoot in FIG. 14 is much less than that in FIG. 6 where the value of capacitors C1 and C2 are equal. FIG. 15 is a graph of the amplifier input voltage or the base voltage of transistor Q1 versus time for circuit 12 of FIG. 1. FIG. 16 is a graph of the total device current versus time for circuit 12 of FIG. 1. There is no 'current bump' or current overshoot in FIG. 16 compared with the significant 'current bump' shown in FIG. 8 where the values of capacitors C1 and C2 are equal. The graph of FIG. 16 shows that capacitor C2 does not accumulate an extra charge, which can discharge through transistor Q2 as it turns on causing damage.

Figure 17:
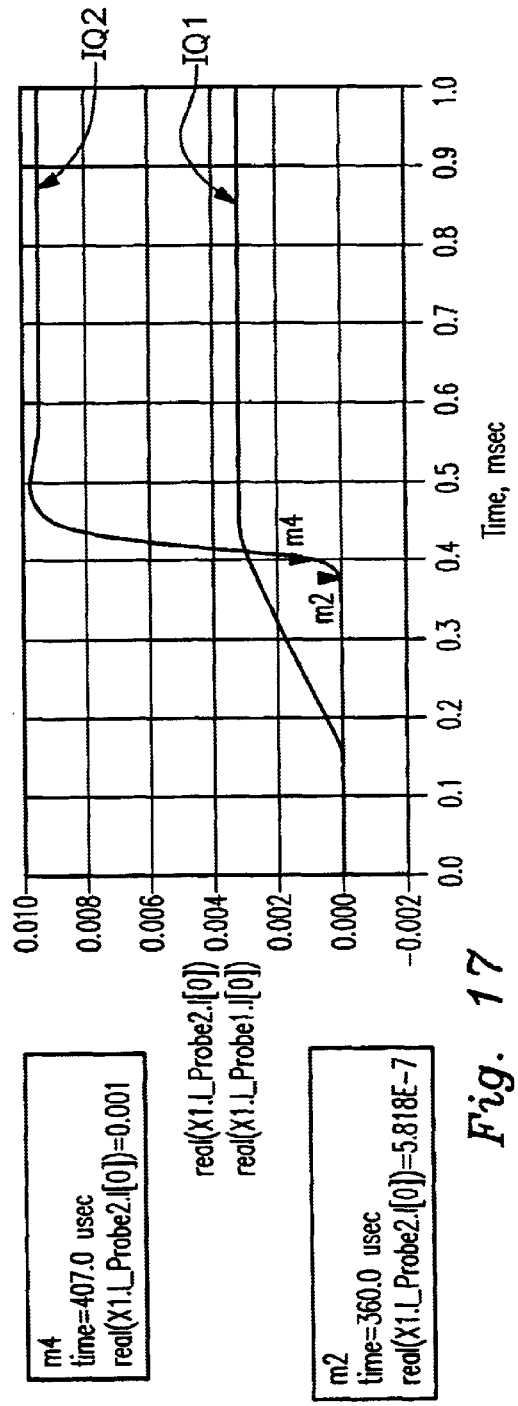
FIG. 17 is a graph of the emitter currents IQ1 and IQ2 through transistors Q1 and Q2 versus time for circuit 12 of FIG. 1 and the value of C2 is 5 times larger than C1.

FIG. 17 shows a graph of the emitter currents IQ1 and IQ2 through transistors Q1 and Q2 versus time for circuit 12 of FIG. 1. As can be seen in FIG. 17, the current IQ2 through transistor Q2 does not have the 'current bump' because capacitor C2 does not accumulate extra charge.

Figure 18:
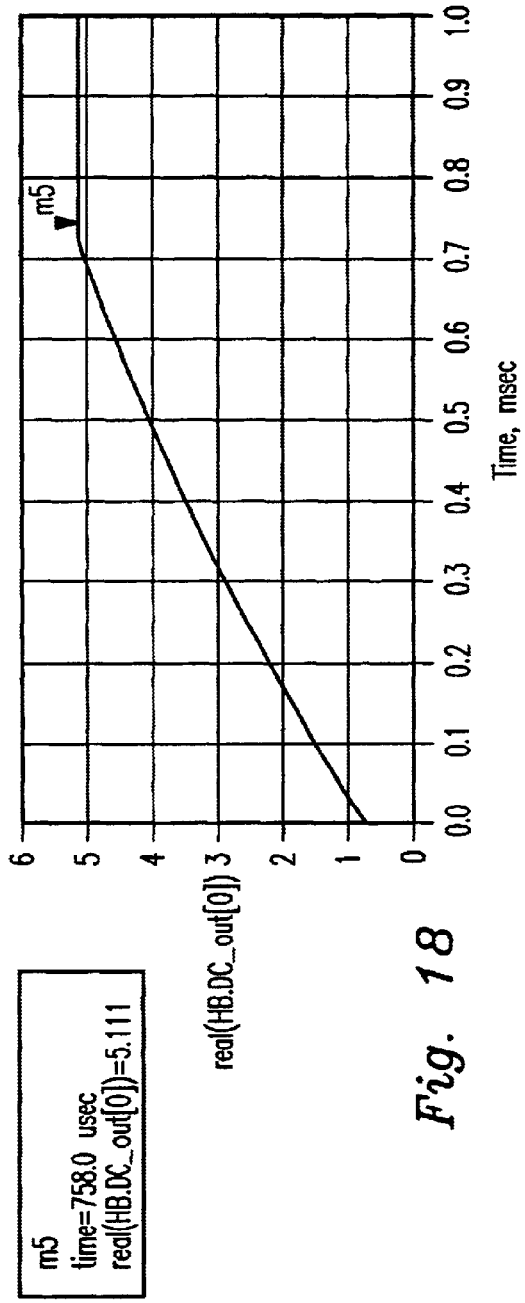
FIG. 18 is a graph of the total amplifier device voltage versus time for circuit 12 of FIG. 1 and the value of C2 is 10 times larger than C1.
Figure 19:
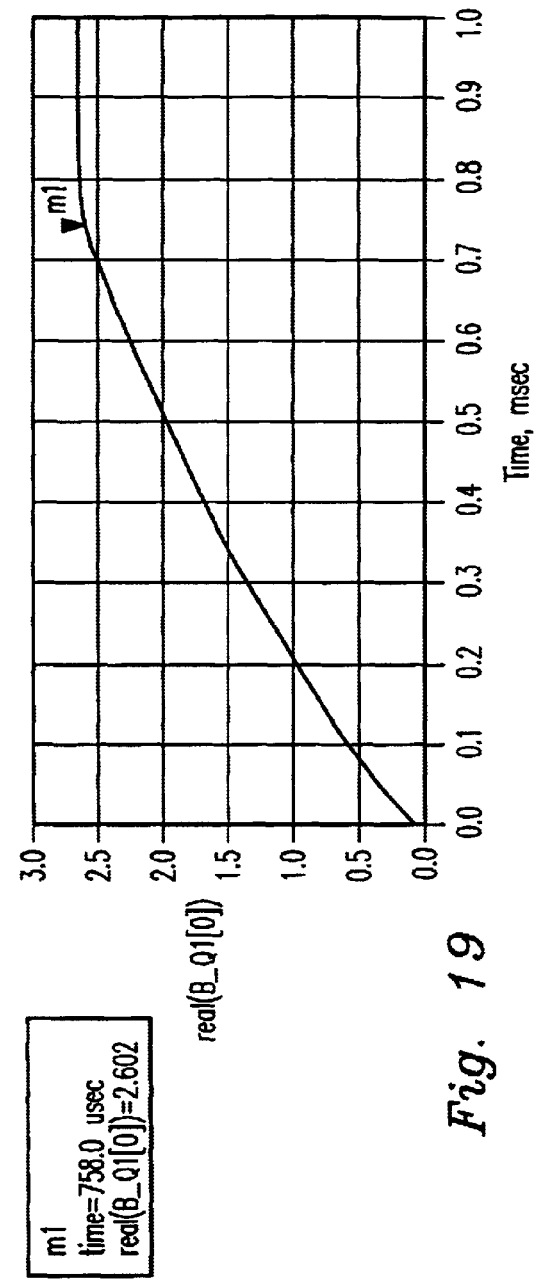
FIG. 19 is a graph of the amplifier input voltage or the base voltage of transistor Q1 versus time for circuit 12 of FIG. 1 and the value of C2 is 10 times larger than C1.
Figure 20:
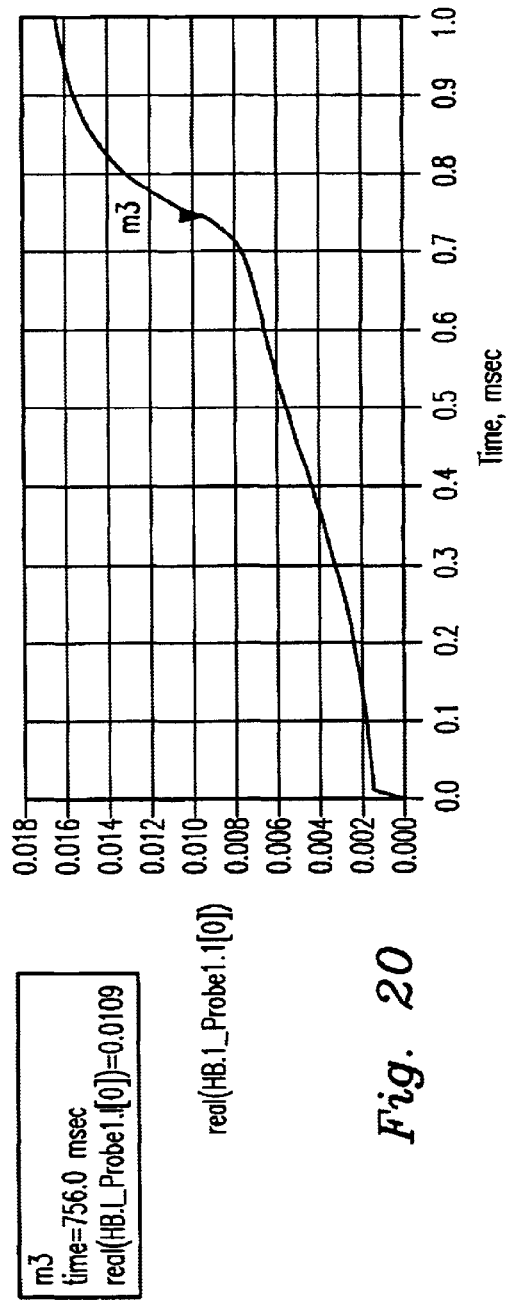
FIG. 20 is a graph of the total device current versus time for circuit 12 of FIG. 1 and the value of C2 is 10 times larger than C1.
Figure 21:
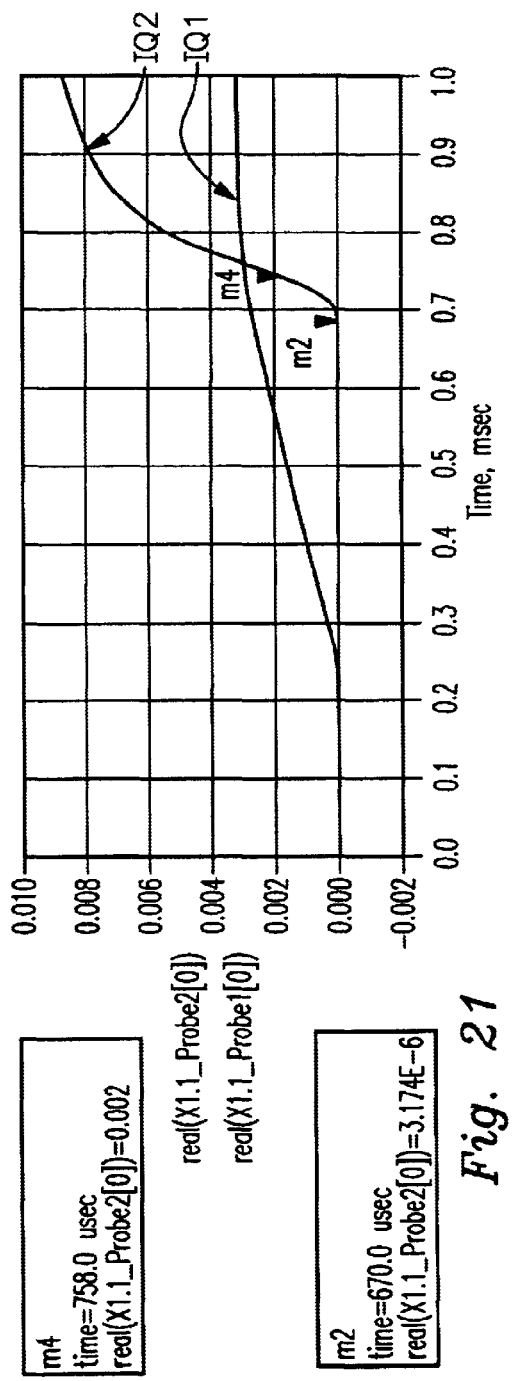
FIG. 21 is a graph of the emitter currents IQ1 and IQ2 through transistors Q1 and Q2 versus time for circuit 12 of FIG. 1 and the value of C2 is 10 times larger than C1.

Referring to FIGS. 18–21, a simulation is shown for circuit 12 of FIG. 1 with the value of capacitor C2 ten times larger than C1. The ratio of C2/C1 is approximately equal to (R1+R5)/R6. FIG. 18 is a graph of the total amplifier device voltage versus time. The 'voltage bump' or overshoot voltage effect is further reduced. FIG. 19 is a graph of the amplifier input voltage or the base voltage of transistor Q1 versus time for circuit 12 of FIG. 1. FIG. 20 is a graph of the total device current versus time for circuit 12 of FIG. 1. The 'current bump' has been eliminated. FIG. 21 is a graph of the emitter currents IQ1 and IQ2 through transistors Q1 and Q2 versus time for circuit 12 of FIG. 1. As can be seen in the graphs, the 'current bump' through transistor Q2 and therefore through the amplifier is eliminated. The 'voltage bump' or overshoot is also eliminated.

Figure 22:
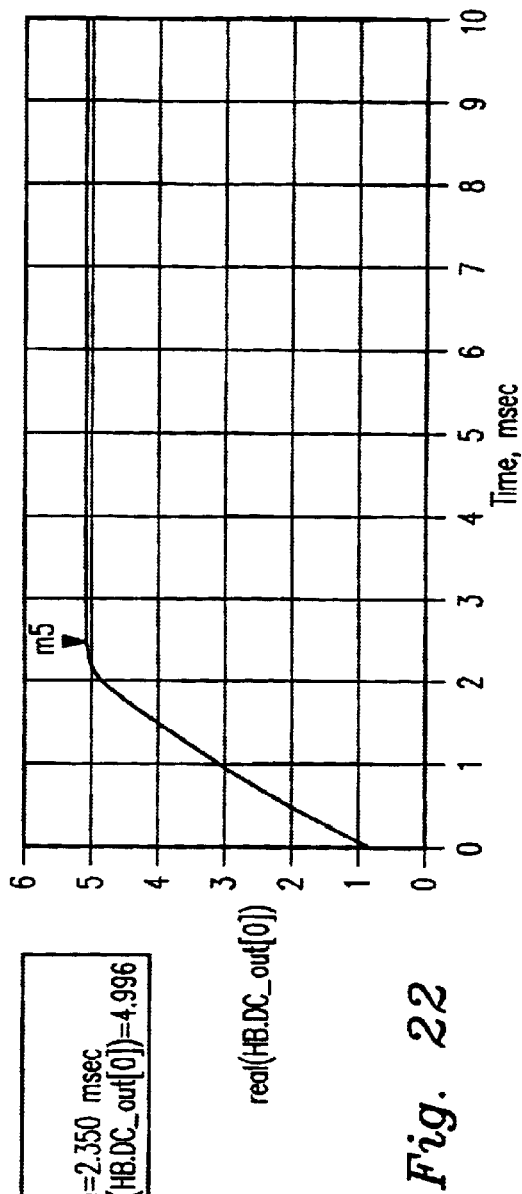
FIG. 22 is a graph of the total amplifier device voltage versus time for circuit 12 of FIG. 1 and the value of C2 is 484 times larger than C1.
Figure 23:
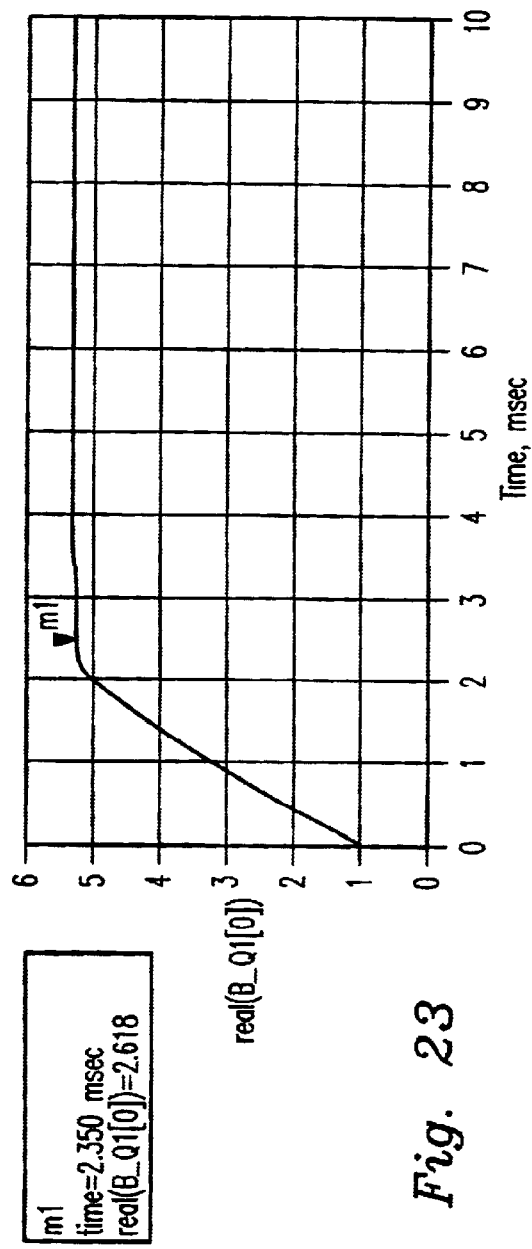
FIG. 23 is a graph of the amplifier input voltage or the base voltage of transistor Q1 versus time for circuit 12 of FIG. 1 and the value of C2 is 484 times larger than C1.
Figure 24:
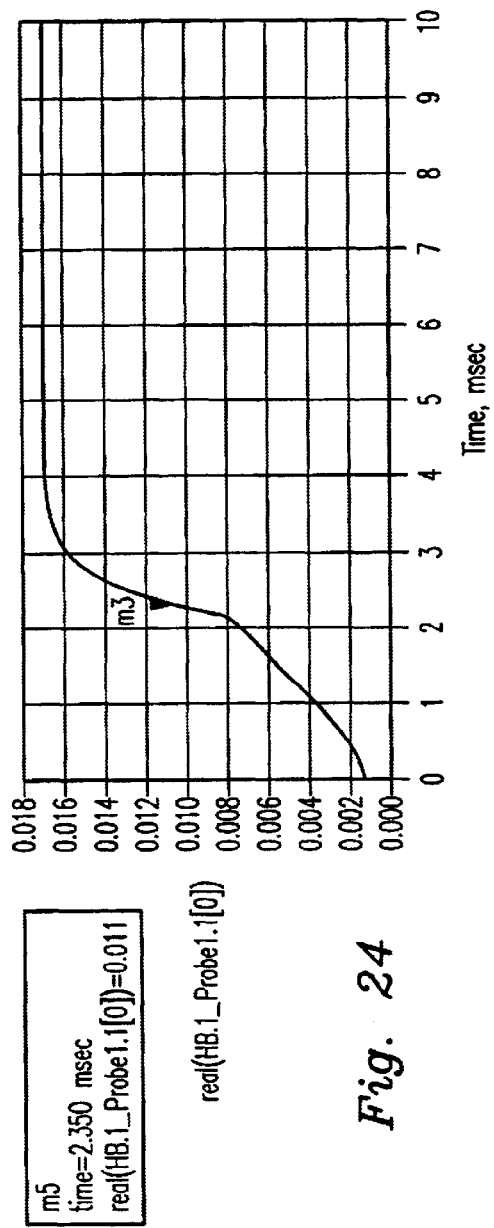
FIG. 24 is a graph of the total device current versus time for circuit 12 of FIG. 1 and the value of C2 is 484 times larger than C1.
Figure 25:
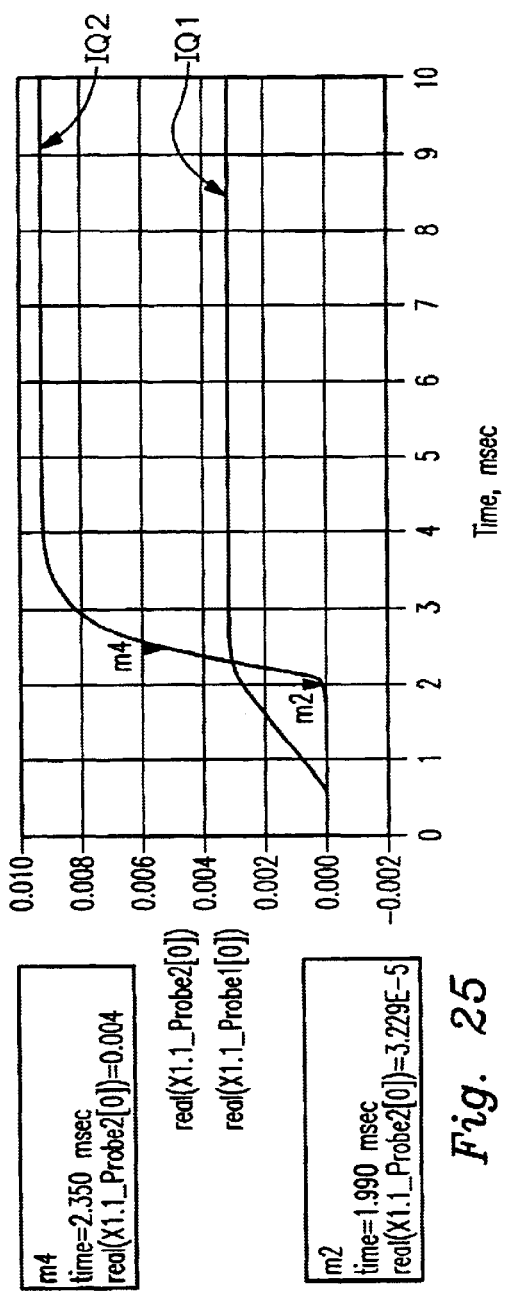
FIG. 25 is a graph of the emitter currents IQ1 and IQ2 through transistors Q1 and Q2 versus time for circuit 12 of FIG. 1 and the value of C2 is 484 times larger than C1.

Referring to FIGS. 22–25, a simulation is shown for circuit 12 of FIG. 1 with the value of capacitor C2 484 times larger than C1. In this case, the ratio of capacitor C2 to C1 is further increased and the ratio is much more than (R1+R5)/R6. In this example C1=0.013 uF and C2=6.3 uF. FIG. 22 is a graph of the total amplifier device voltage versus time for circuit 12 of FIG. 1. There is no 'voltage bump' or overshoot present. FIG. 23 is a graph of the amplifier input voltage or the base voltage of transistor Q1 versus time for circuit 12 of FIG. 1. FIG. 24 is a graph of the total device current versus time for circuit 12 of FIG. 1. There is no 'current bump' or overshoot present. FIG. 25 is a graph of the emitter currents IQ1 and IQ2 through transistors Q1 and Q2 versus time for circuit 12 of FIG. 1. As can be seen in FIGS. 22–25, increasing the ratio of capacitor C2 to C1, beyond the ratio of (R1+R5)/R6 slightly reduces the already insignificant voltage overshoot that was shown in FIGS. 18–21.

Figure 26:
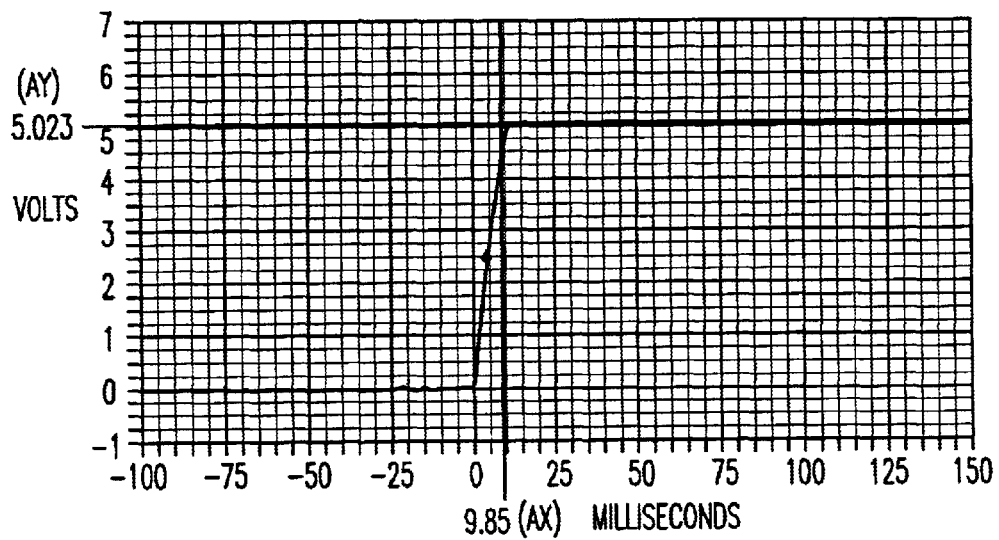
FIG. 26 is a graph of the actual oscilloscope measurement of the amplifier output voltage versus time for circuit 12 of FIG. 1 that was built with C1=0.013 uF and C2=6.3 uF (C2 is 484 times larger than C1).

FIG. 26 shows an actual oscilloscope measurement for the circuit 12 of FIG. 1 that was built with C1=0.013 uF and C2=6.3 uF. FIG. 26 shows that the overshoot problem has been eliminated.

Varying the ratio of the input de-coupling capacitor to the output decoupling capacitor can be done for various Darlington amplifier configurations other than those shown in FIG. 1. This technique can also be applied to non Darlington amplifier configurations including but not limited to pulse amplifiers and video amplifiers.

Figure 27:
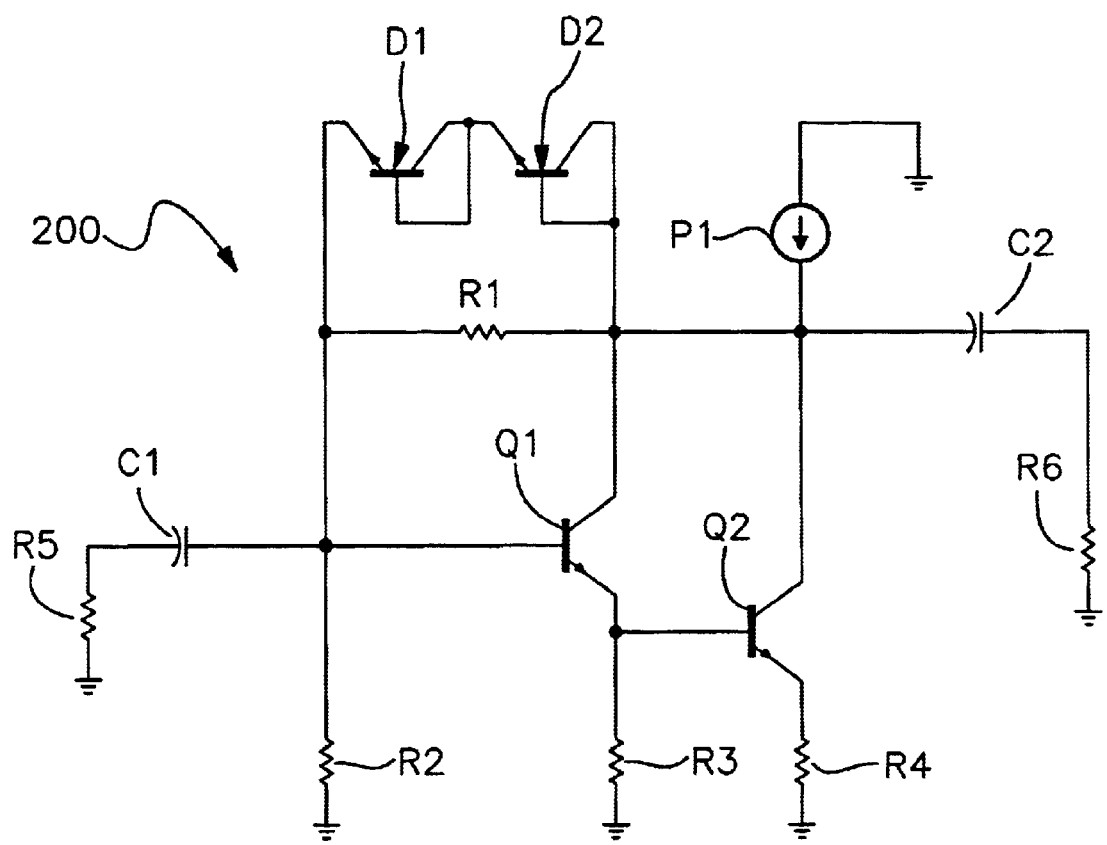
FIG. 27 is a schematic diagram of an alternative embodiment of the present invention.

Turning now to FIG. 27, another embodiment of the present invention is shown. Darlington amplifier circuit 200 has been modified from that shown in FIG. 1. In circuit 200, a pair, for example, of serially connected diodes D1 and D2 have been connected across resistor R1. There can be a single diode, a pair or more diodes connected in series. The number of diodes determines the level of protection of the amplifier. Diodes D1 and D2 are shown as transistors connected as diodes. The emitter of D1 is connected to the base QB1 and resistor R1 junction. The collector of D2 is connected to the collector QC1, resistor R1 junction. The total voltage drop across the diodes D1 and D2 is slightly higher than the voltage drop across resistor R1 in a steady state. At the beginning of the voltage overshoot, the voltage drop across resistor R1 increases above the steady state voltage drop on it and will exceed the opening voltage of the diode pair D1 and D2. At this point, diodes D1 and D2 start to conduct a current and provide some additional current causing capacitor C1 to charge faster. This prevents the overshoot voltage. In the steady state, diodes D1 and D2 do not conduct and are not interfering with the normal RF operation of the amplifier.

Figure 9:
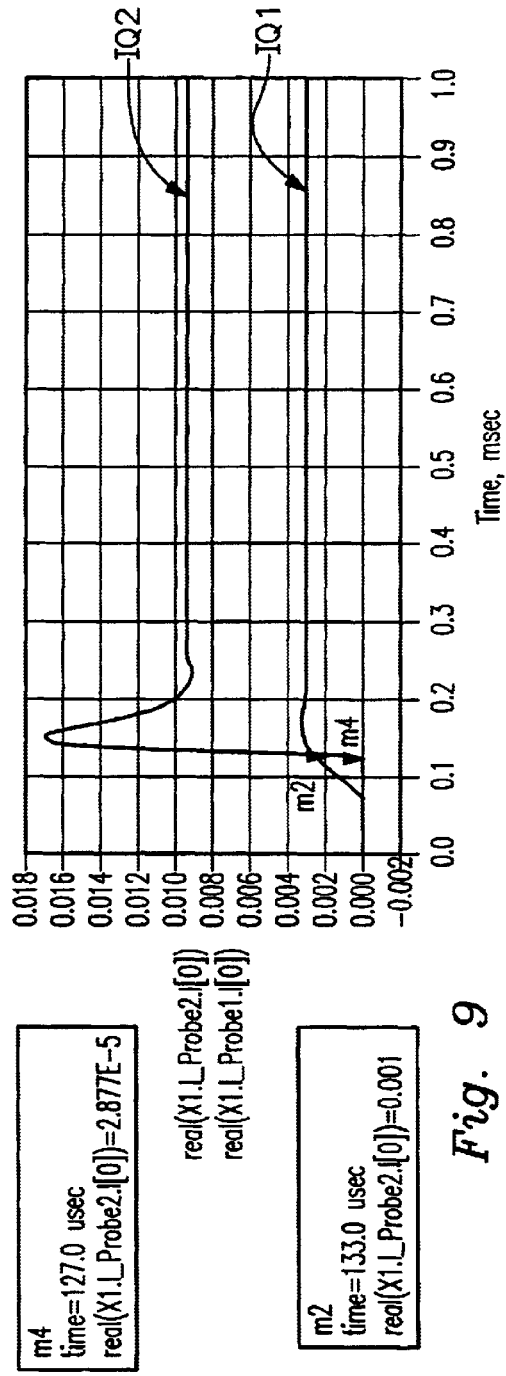
FIG. 9 is a graph of the emitter currents IQ1 and IQ2 through transistors Q1 and Q2 versus time for circuit 12 of FIG. 1.
Figure 10:
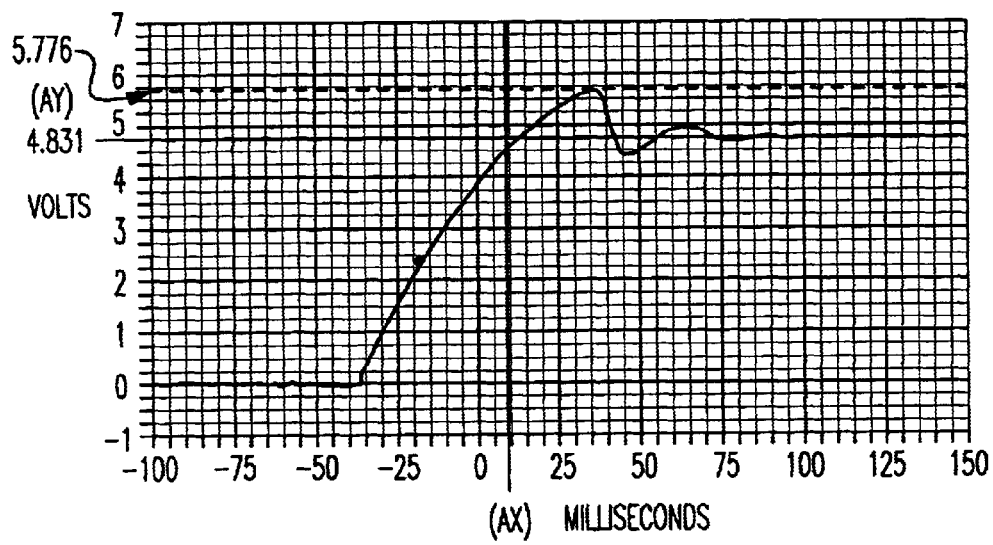
FIG. 10 is a graph of the oscilloscope measurement of the amplifier output voltage versus time for a current source of 11 milli-amps for circuit 12 of FIG. 1.
Figure 11:
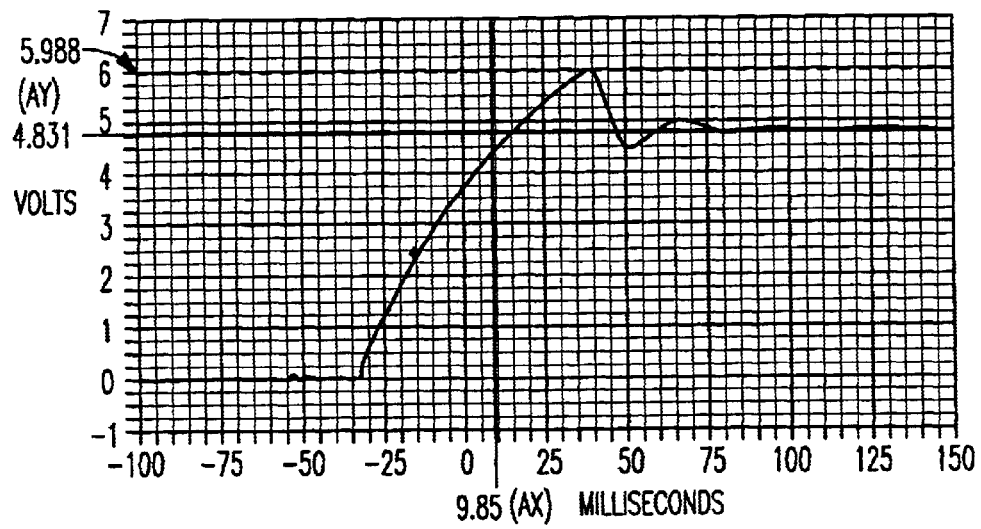
FIG. 11 is a graph of the oscilloscope measurement of the amplifier output voltage versus time for a current source of 12 milli-amps for the circuit 12 of FIG. 1.
Figure 12:
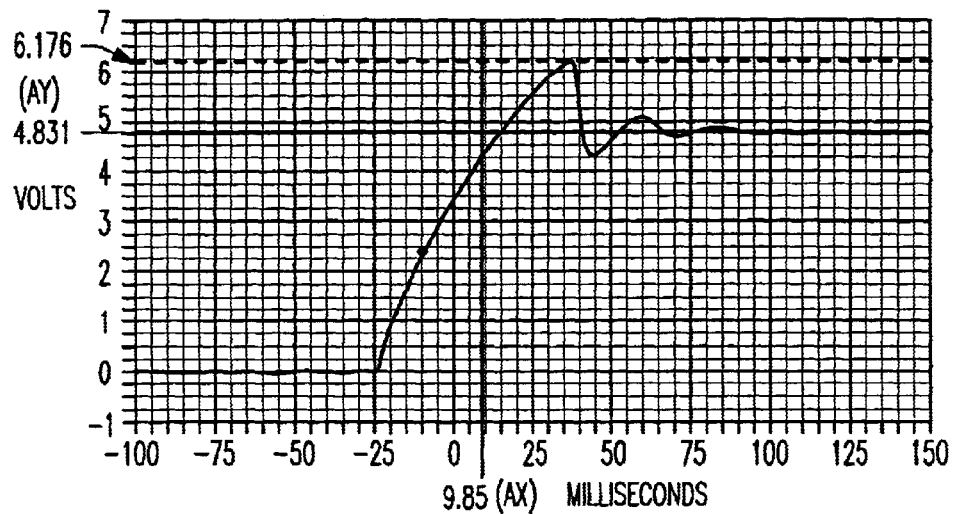
FIG. 12 is a graph of the oscilloscope measurement of the amplifier output voltage versus time for a current source of 13 milli-amps for the circuit 12 of FIG. 1.
Figure 13:
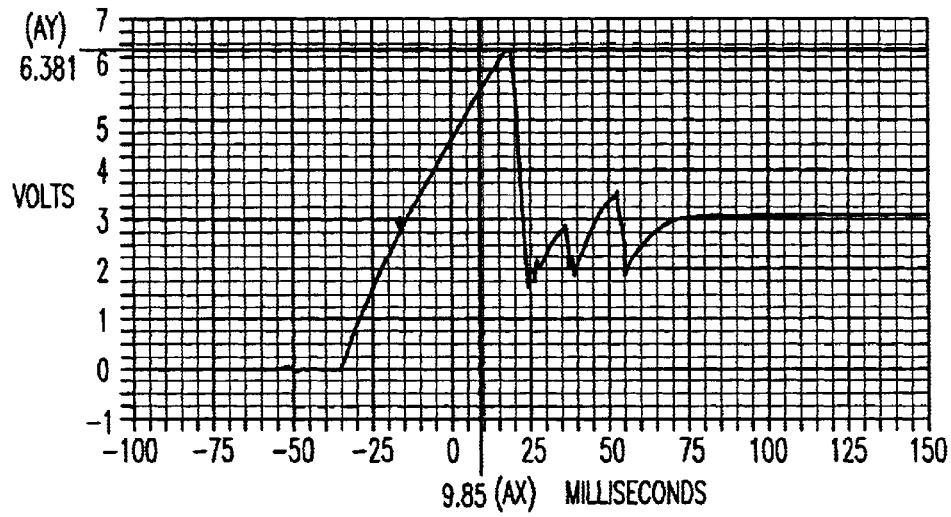
FIG. 13 is a graph of the oscilloscope measurement of the amplifier output voltage versus time for a current source of 14 milli-amps for the circuit 12 of FIG. 1.
Figure 28:
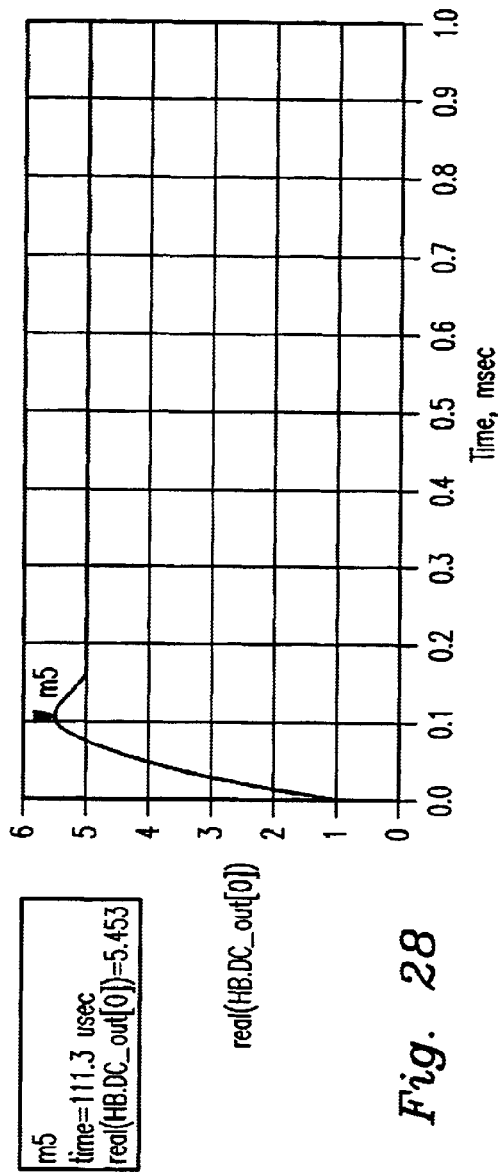
FIG. 28 is a graph of the total amplifier device voltage versus time for circuit 200 of FIG. 27.
Figure 29:
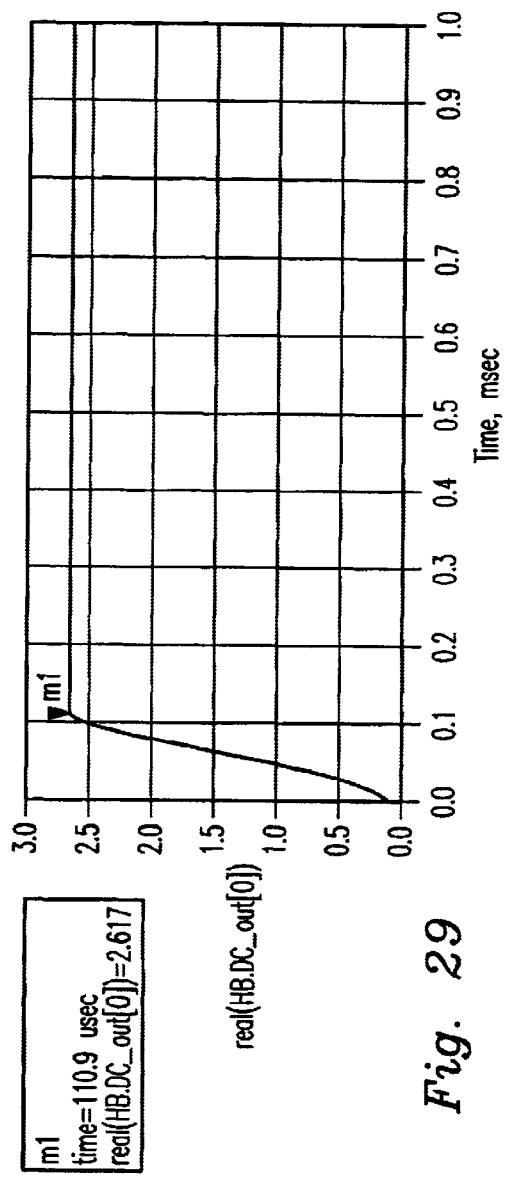
FIG. 29 is a graph of the amplifier input voltage or the base voltage of transistor Q1 versus time for circuit 200 of FIG. 27.
Figure 30:
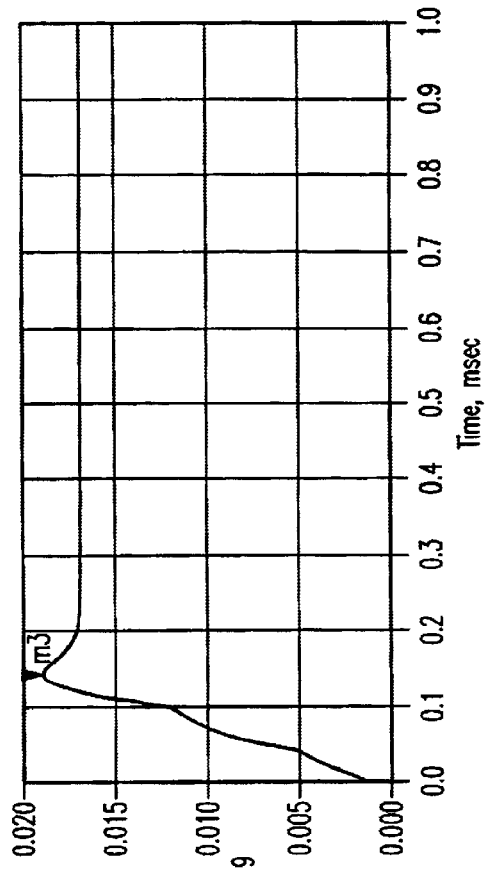
FIG. 30 is a graph of the total device current versus time for circuit 200 of FIG. 27.
Figure 31:
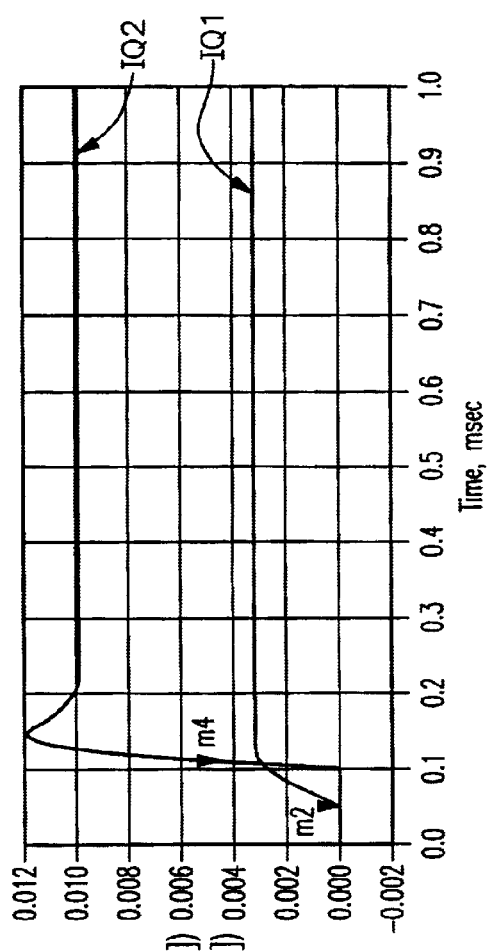
FIG. 31 is a graph of the emitter currents IQ1 and IQ2 through transistors Q1 and Q2 versus time for circuit 200 of FIG. 27.
Figure 32:
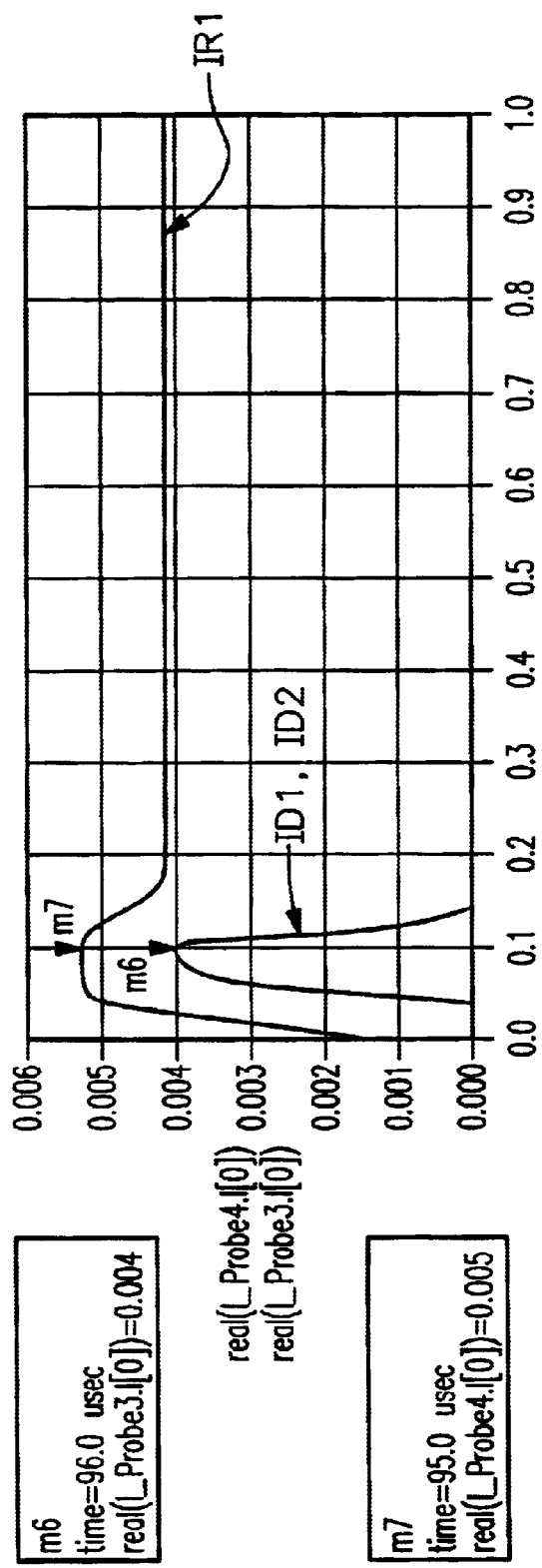
FIG. 32 is a graph of the currents IR1 through resistor R1 and currents ID1, ID2 through diodes D1 and D2 versus time for circuit 200 of FIG. 27.

FIGS. 28–32 show simulated results for circuit 200 in FIG. 27. FIG. 28 is a graph of the total amplifier device voltage versus time for circuit 200 of FIG. 27. The 'voltage bump' is significantly less than in FIG. 6. FIG. 29 shows a graph of the amplifier input voltage or the base voltage of transistor Q1 versus time for circuit 200 of FIG. 27. FIG. 30 is a graph of the total device current versus time for circuit 200 of FIG. 27. The current bump or overshoot current is significantly less than in FIG. 8. FIG. 31 is a graph of the emitter currents IQ1 and IQ2 through transistors Q1 and Q2 versus time for circuit 200 of FIG. 27. The 'current bump' through transistor Q2 is significantly less than that shown in FIG. 9. FIG. 32 is a graph of the current IR1 through resistor R1 and ID1, ID2 through diodes D1 and D2 versus time for circuit 200 of FIG. 27. The peak current ID1, ID2 is almost same value as the peak current IR1 through the resistor R1. Therefore, the total peak current charging capacitor C1 is almost double the value shown in the circuit of FIG. 1. As can be seen in FIGS. 28–31, the overshoot problem is significantly reduced by circuit 200 as compared to circuit 12.

Figure 33:
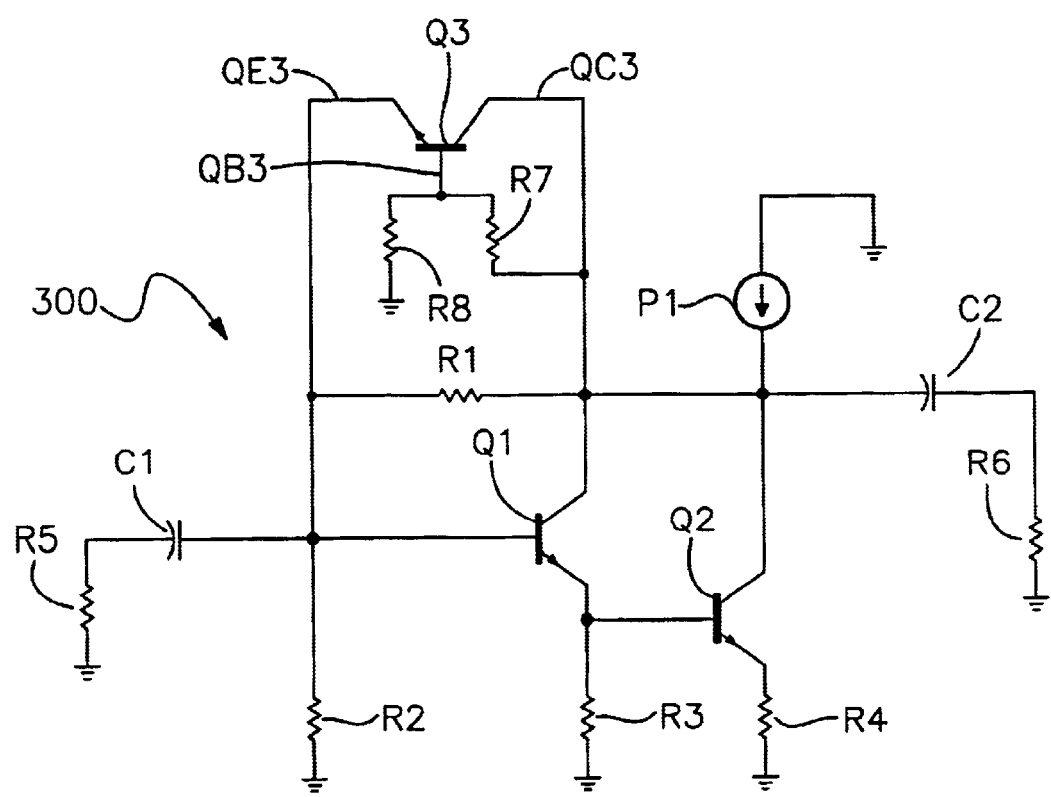
FIG. 33 is a schematic diagram of another embodiment of the present invention.

Turning now to FIG. 33, another embodiment of the present invention is shown. Darlington amplifier circuit 300 of FIG. 33 has been modified from that shown in FIG. 1. In circuit 300, a third transistor Q3 has been connected across resistor R1. Transistor Q3 has a base QB3, an emitter QE3 and a collector QC3. The emitter of transistor Q3 is connected to the junction of base QB1 and resistor R1. The collector of transistor Q3 is connected to the junction of collector QC1 and resistor R1. The base of transistor Q3 is connected to a voltage divider consisting of resistors R7 and R8. Resistor R7 is connected to node the junction of collector QC1, QC3 and resistor R1. Resistor R8 is connected to ground. The ratio of resistors R7 and R8 is chosen based on the maximum required RF peak voltage on the output of the amplifier. The RF peak voltage at the 1 dB compression point determines the resistor R7, R8 division ratio.

The resistor R7, R8 division ratio should be set such that the 1 dB compression point degrades by only 0.1 to 0.2 dB at low frequencies with reference to the 1 dB compression point of the same amplifier but without the protective circuit.

In the steady state, transistor Q3 is not conducting because the voltage on the base of transistor Q3 set by the voltage divider of R7 and R8 is less than the opening voltage Vbe for transistor Q3. Therefore, transistor Q3 does not interfere with the normal RF operation of the amplifier.

During the start up process, the voltage on the base of transistor Q3 increases, turning on transistor Q3, which causes capacitor C1 to charge faster. This prevents the overshoot voltage problem. The circuit 300 of FIG. 33 has the added convenience and ability to finely adjust the voltage protective level by varying the values of resistors R7 and R8. As a side effect, the 1 dB compression point of the amplifier may be slightly degraded by about 0.2 dB less.

Figure 34:
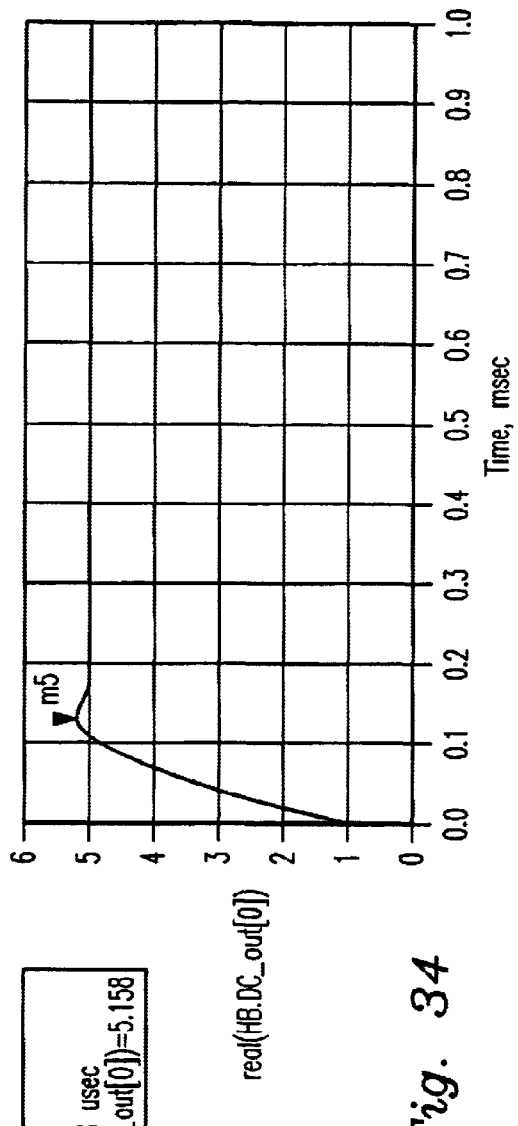
FIG. 34 is a graph of the total amplifier device voltage versus time for circuit 300 of FIG. 33.
Figure 35:
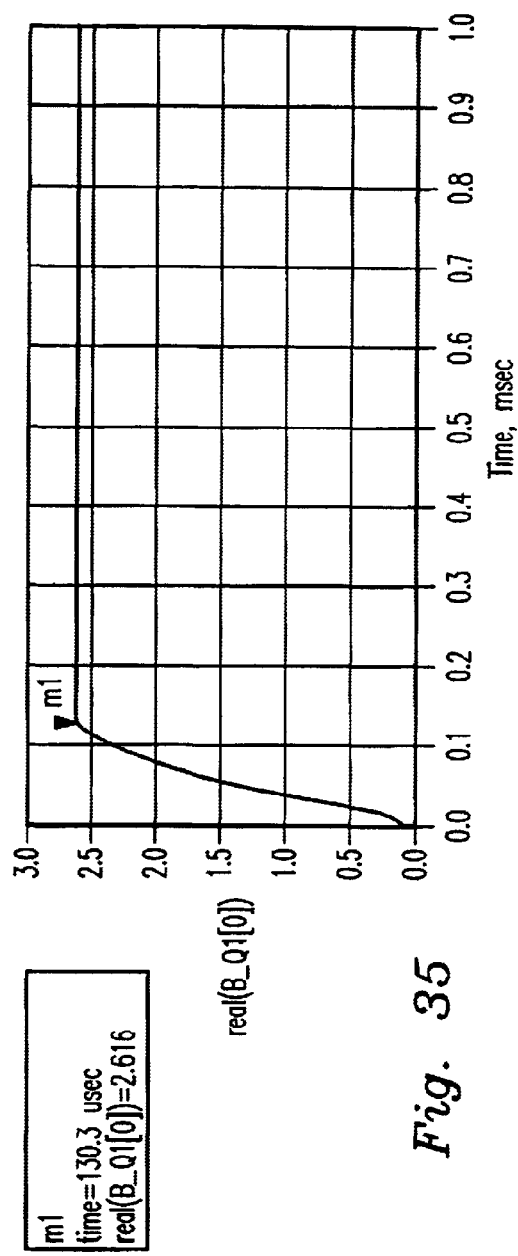
FIG. 35 is a graph of the amplifier input voltage or the base voltage of transistor Q1 versus time for circuit 300 of FIG. 33.
Figure 36:
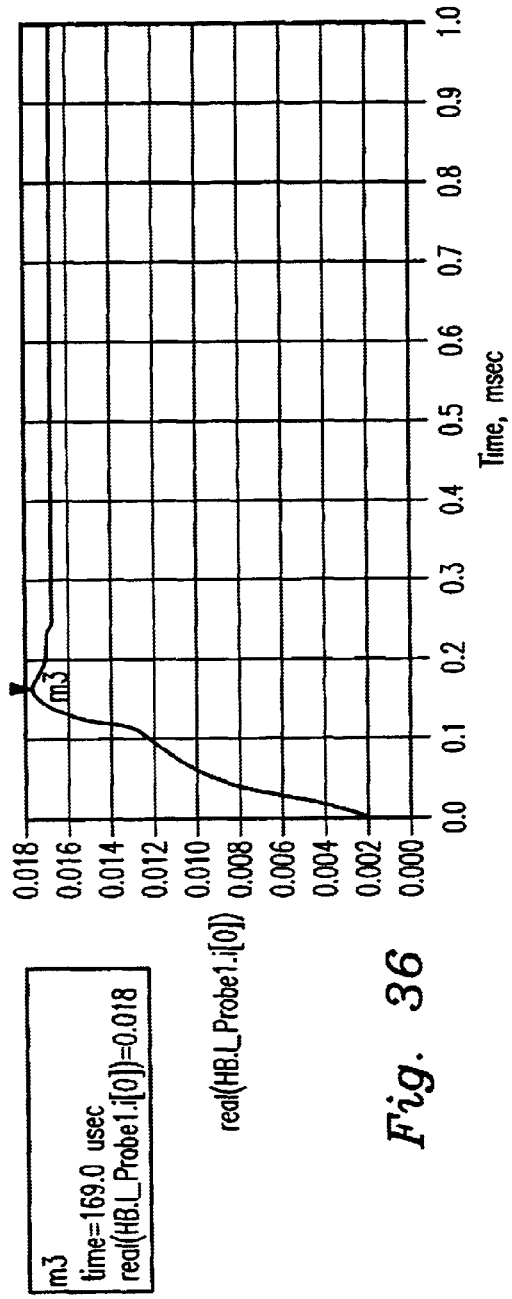
FIG. 36 is a graph of the total device current versus time for circuit 300 of FIG. 33.

FIGS. 34–38 show simulated results for circuit 300. FIG. 34 shows a graph of total amplifier device voltage versus time for circuit 300 of FIG. 33. The 'voltage bump' is further reduced as compared to that shown in FIG. 28. FIG. 35 is a graph of the amplifier input voltage or the base voltage of transistor Q1 versus time for circuit 300 of FIG. 33. FIG. 36 is a graph of the total device current versus time for circuit 300. The 'current bump' is further reduced from that shown in FIG. 30.

Figure 37:
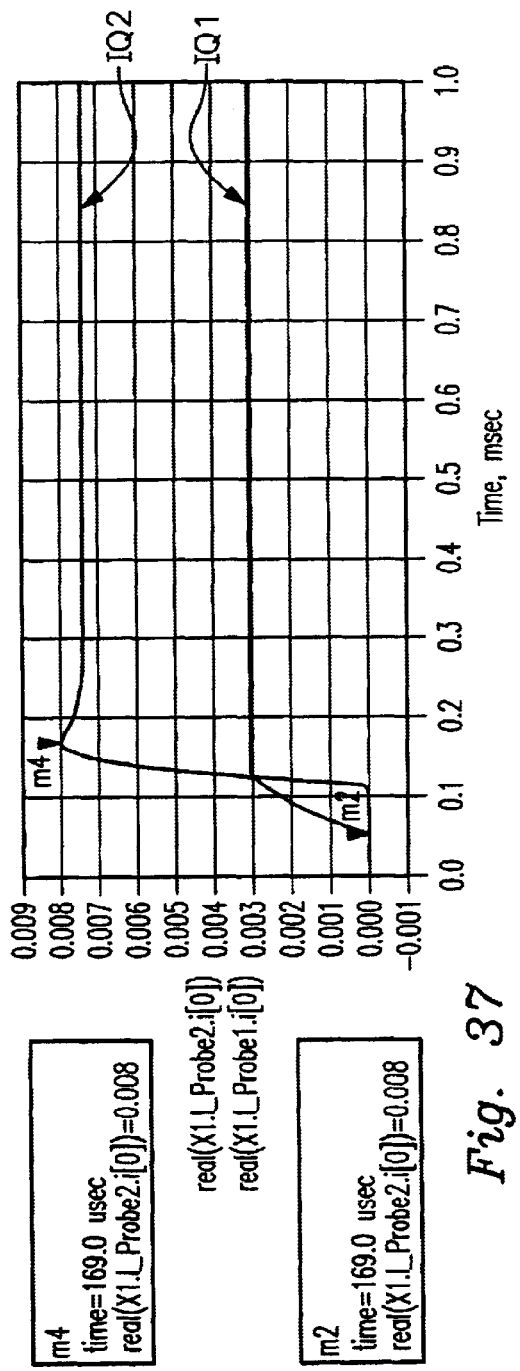
FIG. 37 is a graph of the emitter currents IQ1 and IQ2 through transistors Q1 and Q2 versus time for circuit 300 of FIG. 33.
Figure 38:
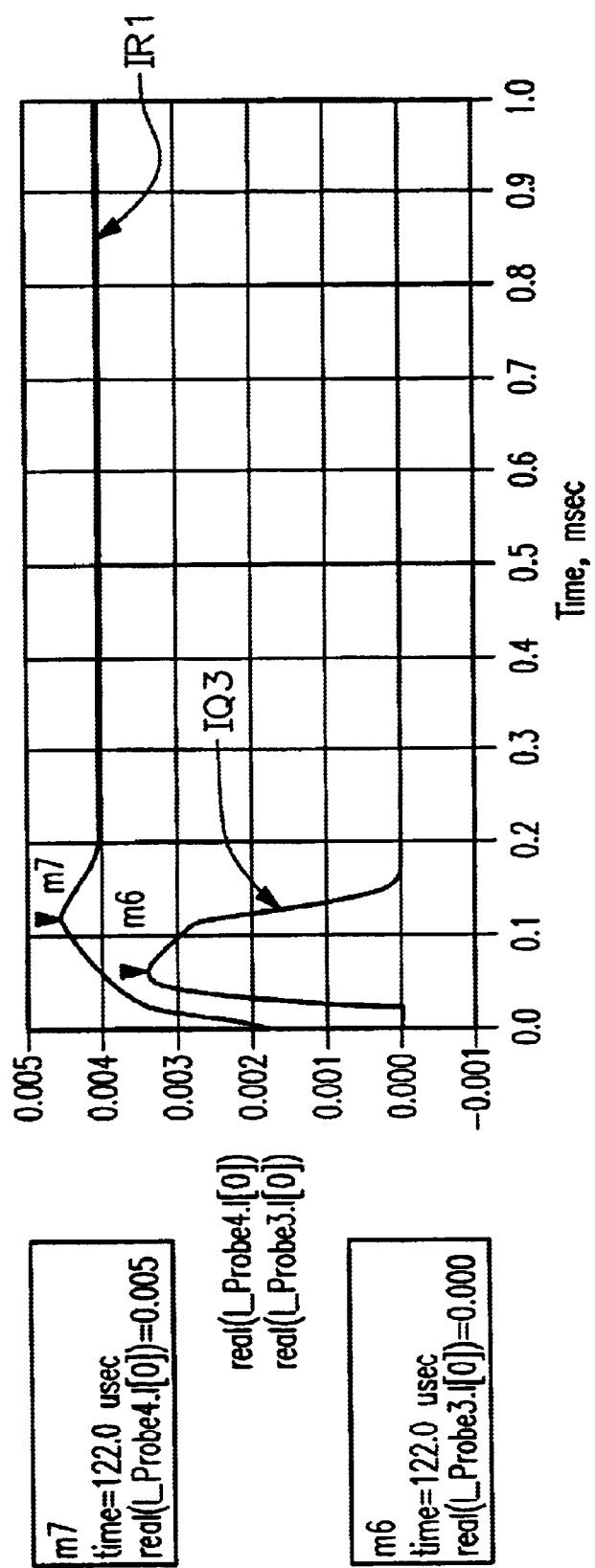
FIG. 38 is a graph of the current IR1 through resistor R1 and current IQ3 through transistor Q3 versus time for circuit 300 of FIG. 33.

FIG. 37 shows a graph of the emitter currents IQ1 and IQ2 through transistors Q1 and Q2 versus time for circuit 300 of FIG. 33. The 'current bump' through transistor Q2 as well as the 'total bump' of the total amplifier current is significantly less than in FIG. 31. FIG. 38 is a graph of the current IR1 through resistor R1 and current IQ3 through transistor Q3 versus time for circuit 300. The peak current IQ3 is almost the same value as the peak current IR1 through resistor R1. Therefore, the total peak current charging capacitor C1 is almost double that shown in circuit 12 of FIG. 1.

As can be seen in FIGS. 34–37, the overshoot problem is significantly reduced by circuit 300.

Figure 39:
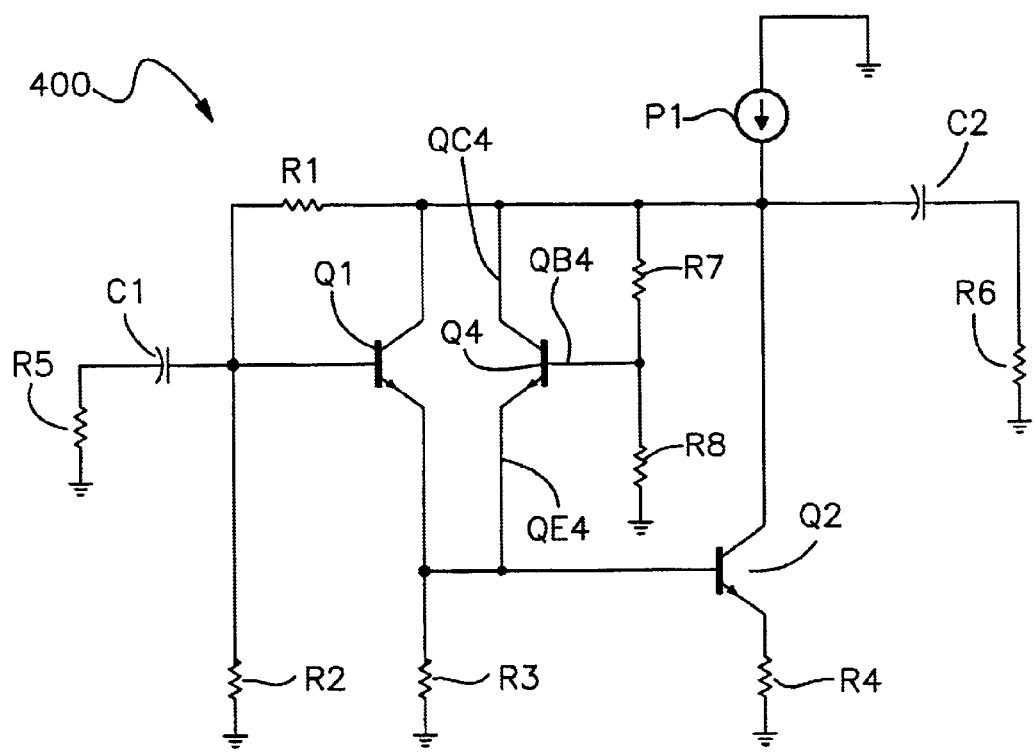
FIG. 39 is a schematic diagram of another embodiment of the present invention.

Referring to FIG. 39, another embodiment of the present invention is shown. Darlington amplifier circuit 400 has been modified from that shown in FIG. 1. In circuit 400, transistor Q4 has been connected in parallel across transistor Q1. Transistor Q4 has a base QB4, an emitter QE4 and a collector QC4. The emitter QE4 of transistor Q4 is connected to the emitter QE1 of Q1. The collector QC4 of transistor Q4 is connected to the collector QC1 of Q1. The base QB4 of transistor Q4 is connected to a voltage divider consisting of resistors R7 and R8. Resistor R7 is connected to the collectors of Q1 and Q4. Resistor R8 is connected to ground.

The ratio of resistors R7 and R8 is chosen based on the maximum required RF peak voltage on the output of the amplifier. The RF peak voltage at the 1 dB compression point determines the resistor R7, R8 division ratio.

The resistor R7, R8 division ratio should be set such that the 1 dB compression point degrades by only 0.1 to 0.2 dB at low frequencies with reference to the 1 dB compression point of the same amplifier but without the protective circuit.

During steady state operation, transistor Q4 does not interfere with the normal RF operation of the amplifier because the base to emitter voltage of transistor Q4, which is set by the resistor divider R7, R8 is below the voltage required to open transistor Q4.

It is noted that circuit 200 would have the least influence on the RF performance of the Darlington amplifier. The circuit changes shown in circuits 200 and 300 can be readily implemented on existing Darlington amplifiers by adding external circuitry. These circuit changes can also be implemented on a semiconductor die during fabrication.

The present invention has several advantages. Changing the ratio of the input to output de-coupling capacitors provides a solution to the problem of voltage overshoot on Darlington amplifiers without extra space needs and the expense of additional components. The three circuit modifications that were shown can also be readily implemented at low cost and uses a minimum amount of additional circuit board space to prevent voltage overshoot on Darlington amplifiers. The invention provides an increase in Darlington amplifier reliability and durability at low cost.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. An amplifier circuit comprising:
   a) a first transistor having a first base, a first collector and a first emitter;
   b) a second transistor having a second base, a second collector and a second emitter, the emitter of the first transistor connected to the base of the second transistor, the collector of the first transistor connected to the collector of the second transistor;
   c) a first resistor connected between the collector of the first transistor and the base of the first transistor;
   d) a second resistor connected between the base of the first transistor and ground;
   e) a first capacitor connected to the base of the first transistor; and
   f) a second capacitor connected to the collectors of the first and second transistors, wherein the second capacitor has a capacitance value at least 5 times larger than the first capacitor.

2. The amplifier circuit according to claim 1, wherein the ratio of the capacitance of the first and second capacitors prevents excessive voltage from developing on the collectors of the first and second transistors.

3. The amplifier circuit according to claim 2, wherein the excessive voltage is developed when the circuit is initially powered on.

4. The amplifier circuit according to claim 1, wherein a third resistor is connected between the emitter of the first transistor and ground.

5. The amplifier circuit according to claim 1, wherein a fourth resistor is connected between the emitter of the second transistor and ground.

6. The amplifier circuit according to claim 1, wherein a current source is connected to the collectors of the first and second transistors.

7. The amplifier circuit according to claim 1, wherein a first and second serially connected diode are connected across the first resistor, the first and second diodes preventing excessive voltage from developing on the collector of the first and second transistors.

8. The amplifier circuit according to claim 1, wherein a third transistor is connected across the first resistor, the third transistor preventing excessive voltage from developing on the collector of the first and second transistors.

9. The amplifier circuit according to claim 8, wherein the third transistor has a base, an emitter and a collector, the collector of the third transistor connected to collector of the first transistor, the emitter of the third transistor connected to the base of the first transistor, the base of the third transistor connected to a parallel combination of a fifth resistor and a sixth resistor, the fifth resistor connected to the collector of the first transistor and the sixth resistor connected to ground.

10. The amplifier circuit according to claim 1, wherein a fourth transistor is connected across the first transistor, the fourth transistor having a base, a collector and an emitter, the collector of the fourth transistor connected to the collector of the first transistor, the emitter of the fourth transistor connected to the emitter of the first transistor, the base of the fourth transistor connected to a combination of a seventh resistor and an eighth resistor, the seventh resistor connected to the collector of the fourth transistor and the eighth resistor connected to ground, the fourth transistor preventing excessive voltage from developing on the collectors of the first and second transistors.

11. An overvoltage protection circuit for an amplifier comprising:
   a) a darlington gain block amplifier having an input terminal and an output terminal;
   b) a first capacitor connected to the base of the first transistor; and
   c) a second capacitor connected to the collectors of the first and second transistors, wherein the second capacitor has a capacitance value greater than the first capacitor, the larger second capacitor preventing an excessive voltage from developing on the collector of the first transistor during startup.

12. The circuit according to claim 11, wherein the second capacitor has a capacitance value at least 5 times larger than the first capacitor.

13. The circuit according to claim 11, wherein the darlington gain block amplifier includes:
   a) a first transistor having a first base, a first collector and a first emitter; and
   b) a second transistor having a second base, a second collector and a second emitter, the emitter of the first transistor connected to the base of the second transistor, the collector of the first transistor connected to the collector of the second transistor.

14. An amplifier circuit comprising:
   a) a first transistor having a first base, a first collector and a first emitter;
   b) a second transistor having a second base, a second collector and a second emitter, the emitter of the first transistor connected to the base of the second transistor, the collector of the first transistor connected to the collector of the second transistor;
   c) a first resistor connected between the collector of the first transistor and the base of the first transistor;
   d) a second resistor connected between the base of the first transistor and ground;
   e) a first capacitor connected to the base of the first transistor;
   f) a second capacitor connected to the collectors of the first and second transistors; and
   g) two serially connected diodes connected across the first resistor, the diodes preventing excessive voltage from developing on the collector of the first and second transistors.

15. An amplifier circuit comprising:
   a) a first transistor having a first base, a first collector and a first emitter;
   b) a second transistor having a second base, a second collector and a second emitter, the emitter of the first transistor connected to the base of the second transistor, the collector of the first transistor connected to the collector of the second transistor;
   c) a first resistor connected between the collector of the first transistor and the base of the first transistor;

d) a second resistor connected between the base of the first transistor and ground;

e) a first capacitor connected to the base of the first transistor;

f) a second capacitor connected to the collectors of the first and second transistors; and g) a third transistor connected across the first resistor, the third transistor preventing excessive voltage from developing on the collector of the first and second transistors.

16. The amplifier circuit according to claim 15, wherein the third transistor has a base, an emitter and a collector, the collector of the third transistor connected to the collector of the first transistor, the emitter of the third transistor connected to the base of the first transistor, the base of the third transistor connected to a parallel combination of a fifth resistor and a sixth resistor, the fifth resistor connected to the collector of the first transistor and the sixth resistor connected to ground.

17. An amplifier circuit comprising:

a) a first transistor having a first base, a first collector and a first emitter;

b) a second transistor having a second base, a second collector and a second emitter, the emitter of the first transistor connected to the base of the second transistor, the collector of the first transistor connected to the collector of the second transistor;

c) a first resistor connected between the collector of the first transistor and the base of the first transistor;

d) a second resistor connected between the base of the first transistor and ground;

e) a first capacitor connected to the base of the first transistor;

f) a second capacitor connected to the collectors of the first and second transistors; and g) a fourth transistor connected across the first transistor, the fourth transistor preventing excessive voltage from developing on the collectors of the first and second transistors.

18. The amplifier circuit according to claim 17, wherein the fourth transistor has a base, a collector and an emitter, the collector of the fourth transistor connected to the collector of the first transistor, the emitter of the fourth transistor connected to the emitter of the first transistor, the base of the fourth transistor connected to a parallel combination of a seventh resistor and an eighth resistor, the seventh resistor connected to the collector of the first transistor and the eighth resistor connected to ground.

19. An overvoltage protection circuit for transistors comprising:

a) a first and second transistor, each transistor having a base, a collector and an emitter, the first and second transistor connected in a darlington configuration;

b) a biasing network coupled to the first and second transistors for supplying a bias voltage to the first and second transistors;

c) a first and second de-coupling capacitor coupled to the first and second transistors; and d) the second capacitor having a larger capacitance than the first capacitor such that excessive voltage is prevented from developing on the collector of the first and second transistors.

20. The circuit according to claim 19, wherein the second capacitor has a capacitance value at least 5 times larger than the first capacitor.

* * * * *